United States Patent [19]
Van Buskirk et al.

[11] Patent Number: 5,579,274
[45] Date of Patent: Nov. 26, 1996

[54] SENSE CIRCUIT FOR A FLASH EEFPROM CELL HAVING A NEGATIVE DELTA THRESHOLD VOLTAGE

[75] Inventors: Michael A. Van Buskirk; Michael Briner, both of San Jose, Calif.

[73] Assignee: Advanced Micro Devices, Inc., Sunnyvale, Calif.

[21] Appl. No.: 483,038

[22] Filed: Jun. 6, 1995

Related U.S. Application Data

[62] Division of Ser. No. 135,224, Oct. 13, 1993, Pat. No. 5,477,499.

[51] Int. Cl.[6] .................................................. G11C 7/02
[52] U.S. Cl. ............... 365/208; 365/185.24; 365/185.30; 365/185.33; 365/207
[58] Field of Search .................................... 365/207, 208, 365/185, 900, 185.24, 185.30, 185.33

[56] References Cited

U.S. PATENT DOCUMENTS 4,962,482  10/1990  Jinbo ........................................ 365/207
4,974,207  11/1990  Hashimoto ............................... 365/207

*Primary Examiner*—David C. Nelms
*Assistant Examiner*—F. Niranjan
*Attorney, Agent, or Firm*—Skjerven, Morrill, MacPherson, Franklin & Friel; Forrest E. Gunnison

[57] ABSTRACT

A flash EEPROM array includes a plurality of flash EEPROM cells and the flash EEPROM array has both a low power supply voltage $V_{CC}$ and high speed performance. This high speed performance is achieved by utilizing overerasure, a condition that was previously viewed as making a flash EEPROM cell inoperative. Specifically, the integrated circuit of this invention includes a flash EEPROM array wherein each flash EEPROM cell is overerased, and circuit means which erases, reads, and programs the overerased flash EEPROM cells. In each operation, the circuit means isolates all of the flash EEPROM cells in the array except a selected flash EEPROM cell so that leakage currents do not affect the flash EEPROM cell selected for the operation. The ability to perform the read operation on an overerased flash EEPROM cell is the mechanism that maintains the speed performance of the flash EEPROM array with the low power supply voltage.

23 Claims, 13 Drawing Sheets

FIG. 4 ERASE

SENSE CIRCUIT FOR A FLASH EEPROM CELL HAVING A NEGATIVE DELTA THRESHOLD VOLTAGE

This application is a division of application Ser. No. 08/135,224, filed Oct. 13, 1993, U.S. Pat. No. 5,477,499.

BACKGROUND OF THE INVENTION

1. Field of the Invention

This invention relates generally to a nonvolatile memory and more specifically to a memory architecture for a three volt flash electrically erasable programmable read only memory.

1. Description of Related Art

Flash EEPROMs (electrically erasable programmable read only memory) are nonvolatile memory devices that are gaining widespread use in the computer industry. The operation and structure of one flash EEPROM is discussed in U.S. Pat. No. 4,698,787 issued on Oct. 6, 1987, to Mukherjee et al., which is incorporated herein by reference in its entirety. Another discussion of the operation and structure of a flash EEPROM, which is also incorporated herein by reference in its entirety, is Gheroge Samashisa, et al., "A 128K Flash EEPROM Using Double-Polysilicon Technology," *IEEE Journal of Solid State Circuits*, Vol. SC-22, No. 5, BP 676-83, October 1987.

Flash EEPROMs provide many advantages over other nonvolatile memory devices. One particularly advantageous flash EEPROM array is disclosed in U.S. Pat. No. 5,077,691, entitled "Flash EEPROM Array With Negative Gate Voltage Erase Operation," of S. Haddad et al., issued on Dec. 31, 1991 ("the '691 patent").

FIG. 1 is a block diagram of the architecture disclosed in the '691 patent. An array 100 of flash EEPROM cells 101 has a plurality of bit lines BL-0 to BL-n and a plurality of word lines WL-0 to WL-m. Each flash EEPROM cell 101, which may be either a symmetric cell or an asymmetric cell, includes a control gate 103 that is connected to a word line WL, a floating gate, a source S that is tied to the source of each cell in array 100, and a drain D that is connected to a bit line BL.

As used herein, "a symmetric cell" 200 has a source region 201 and a drain region 202, which are formed using the same process steps, and which are laid-out symmetrically about a vertical line drawn 205 through the center of the control gate 203 in a cross-sectional cut of the cell. An "asymmetric cell" also has a source and a drain region, but an additional process step or steps have been used to form one of the source and drain regions so that the source and drain regions are no longer laid-out symmetrically about a vertical line drawn 205 through the center of the control gate 203 in a cross-sectional cut of the cell.

As is known to those skilled in the art, the integrated circuit containing flash EEPROM array 100 includes buffers, sense amplifiers, and column and row address circuitry. In FIG. 1, only the switching mechanisms 121, 111 that provide various voltage sources to bit lines BL-0 to BL-n and word lines WL-0 to WL-m are illustrated.

Table 1 gives voltage $V_G$, which is applied to gate 103, voltage $V_D$, which is applied to drain D, and voltage $V_s$, which is supplied to source S, for reading, programming and erasing of each cell 101 in array 100. Voltage $V_s$ was varied in a positive range from above zero to voltage $V_{CC}$, typically 0.5 volts to +5 volts and usually in the range of +4 volts to +6 volts. Power supply voltage $V_{CC}$ was +5 volts.

TABLE 1

| Operation Mode | $V_G$ | $V_D$ | $V_S$ |
| --- | --- | --- | --- |
| Read | $V_{CC}$ | +1.0 V to +2.0 V | 0 V |
| Cell Programming | +12 V | +6 V | 0 V |
| Program Inhibit of Row | 0 V | +6 V or 0 V | 0 V |
| Program Inhibit of Column | +12 V or 0 V | 0 V | 0 V |
| Erase | −10.5 V | Float | 5 V |
| Erase Inhibit of Row | 0 V to $V_S$ | Float | 0 V to $V_S$ |

Herein, "V" is used to represent "volts" while a "V" with a subscript represents either a particular voltage level or a particular voltage supply.

The programming of flash EEPROM cells 101 was accomplished by hot electron injection into the floating gate while erasure via gate 103 with a negative voltage depended upon Fowler Nordheim tunneling. Negative voltage gate erasure provided many advantages, which are discussed in U.S. Pat. No. 5,126,808 entitled "Flash EEPROM Array With Paged Erase Architecture," of A. J. Montalvo and M. A. Van Buskirk issued on Jun. 30, 1992, and the '691 patent, both of which are incorporated herein by reference in their entirety.

A common problem with flash EEPROM array 100, which limits the functionality of array 100, is the bit overerasure phenomenon. If an unprogrammed flash EEPROM cell is repeatedly erased, the floating gate may acquire a positive charge such that a positive potential is created in the floating gate. This positive charge may form a channel region even though no voltage is applied to the control gate.

When the positive potential on the floating gate was sufficient to turn on the flash EEPROM cell, sometimes referred to as "cell" the overerasure prevented reading of any other cell in the array column containing the overerased cell due to leakage current from the unselected overerased cell(s). Consequently, flash EEPROM arrays with an overerased cell were considered inoperative. Typically, either the flash EEPROM array was replaced or the column with the overerased cell was isolated from the array and the array was repaired with redundant cells included in the integrated circuit.

Another short coming of flash EEPROM array 100 is that as the control gate voltage used in a read becomes lower the conductance of memory array cell 101 becomes less. More specifically, the conductance reduces at least linearly with the reduction in the control gate voltage. The resulting reduction in current results in a slower bit line capacitance discharge time assuming that the bit line capacitance is not reduced proportionately with the current reduction. The slower bit line discharge time results in slower access time performance of the memory array.

As computers become smaller, the power supply voltage is dropping to about three volts while the speed is increasing. Therefore, the current flash EEPROM architectures are not suitable for use in such computers because the performance of the flash EEPROM degrades the performance of the computer. Unfortunately with continued scaling of the flash EEPROM cell, the channel implant concentration is generally increased. The increased concentration increases the threshold voltage of the cell. This increase in threshold voltage further reduces the current sinking capability of flash EEPROM cell 101. In summary, the limitations introduced by the threshold voltage coupled with the overerasure problems appear to limit the use of flash EEPROMs at low voltages and high speed.

SUMMARY OF THE INVENTION

According to the principles of this invention, a flash EEPROM array includes a plurality of flash EEPROM cells and the flash EEPROM array has both a low power supply voltage $V_{CC}$ and high speed performance. This advance in performance is achieved by utilizing overerasure, a condition that was previously viewed as making a flash EEPROM cell inoperative.

Specifically, the integrated circuit of this invention includes a flash EEPROM array wherein each unprogrammed flash EEPROM cell is overerased, and circuit means which overerases the flash EEPROM cells and also reads and programs the overerased flash EEPROM cells. In each operation, the circuit means isolates all of the flash EEPROM cells in the array except a selected flash EEPROM cell so that leakage currents from the unselected flash EEPROM cells do not affect operation of the selected flash EEPROM cell. The ability to perform the read operation on an overerased flash EEPROM cell is the mechanism that maintains the speed performance of the flash EEPROM array with a lower power supply voltage than that used with prior art flash EEPROM arrays.

Thus, unlike the prior art flash EEPROM arrays that considered an overerased flash EEPROM cell as a failure, according to the principles of this invention, all the flash EEPROM cells in the array, with the possible exception of the programmed cells, are operated in an overerased condition. The overerasure of the flash EEPROM cells, sometimes called "cells", makes it possible to use a low power supply voltage, e.g., about 3 volts, and achieve a speed performance of 100 nanoseconds or better.

The flash EEPROM array of this invention includes a plurality of flash EEPROM cells. Each flash EEPROM cell includes a control gate that is connected to a word line, a drain that is connected to a bit line, a floating gate, and a source that is tied to each of the other sources in the flash EEPROM array. The flash EEPROM array in this invention can be either a complete array or a page of a complete array.

In this invention, careful attention must be paid to the biasing on the drain and the source of the flash EEPROM cell. In some operations, e.g., the read operation, the voltage level applied to source S is greater than the voltage level applied to drain D and so drain D functions electrically as the source and source S function electrically as the drain. Hence, drain D and source S are initially defined using the conventional structure, i.e., drain D is connected to a bit line. However, when the biasing changes the electrical function, the specific electrical function is stated, i.e., "the drain functions electrically as the source".

In one embodiment of this invention, the circuit means includes a word line control circuit, a bit line control circuit, and a common source control circuit. Each word line is connected to the word line control circuit that includes row address circuitry as well as circuitry to selectively connect and disconnect each of voltages $V_{READ}{}^{R}$, $V_{READ}{}^{R\text{-}INHIBIT}$, $V_{PROGRAM}{}^{R}$, $-V_{PROGRAM}{}^{R\text{-}INHIBIT}$, $V_{ERASE}{}^{R}$, $V_{ERASE}{}^{R\text{-}INHIBIT}$, and $V_{PROGRAM}{}^{R\text{-}VERIFY}$ to each word line. A switch means selectively disconnects and connects each word line to each of the plurality of word line voltage sources.

Each bit line is connected to the bit line control circuit that includes sense amplifiers, and column address circuitry as well as circuitry to selectively connect and disconnect each of voltages $V_{PROGRAM}{}^{C}$, $V_{PROGRAM}{}^{C\text{-}INHIBIT}$, $V_{READ}{}^{C}$ and $V_{READ}{}^{C\text{-}INHIBIT}$ to each bit line as well as to float each bit line. A switch means selectively disconnects and connects each bit line to each of the plurality of bit line voltage sources and floats each bit line. The overerasure of the flash EEPROM cells in the flash EEPROM array requires a novel sense circuit, which is described more completely below.

Each source S of each flash EEPROM cell is tied to a common source control circuit that includes circuitry to ground and to apply a predetermined voltage, e.g. the power supply voltage $V_{CC}$ or a voltage greater than power supply voltage $V_{CC}$ to the tied sources. Again, a switch means is used to selectively connect and disconnect these voltages to the tied sources.

As explained above, source S of a flash EEPROM cell electrically becomes the drain of the flash EEPROM cell and drain D electrically becomes the source of the flash EEPROM cell in a read operation because a larger potential is applied to source S than to drain D. Accordingly, normal sense circuitry will not work with the flash EEPROM array architecture of this invention because such sense circuitry is designed to function only with EEPROM cells that have a positive delta threshold voltage.

In the novel sense circuitry of this invention, a first voltage level, e.g., power supply voltage $V_{CC}$, is connected to source S of the array flash EEPROM cell. Drain D of the flash EEPROM cell is coupled by a first resistive element to a second voltage level, e.g., ground, which is less than said first voltage level. Thus, source S functions electrically as the drain and drain D functions electrically as the source. A first cascode preamplifier, which drives one input line of a comparator, is connected between the first resistive element and drain D of the array flash EEPROM cell.

The first voltage level also is connected to source SR of a reference flash EEPROM cell. Drain DR of the reference flash EEPROM cell is coupled by a second resistive element to the second voltage level. Thus, this source SR is also functioning electrically as the drain and drain DR is functioning electrically as the source. A second cascode preamplifier, which drives another input line of the comparator, is connected between the second resistive element and drain DR of the reference flash EEPROM cell. The ratio of the resistance of the first resistive element to the resistance of the second resistive element defines a sense ratio N. Sense ratio N, in one embodiment, is greater than one.

An important aspect of the invention is that the first and second resistive elements as well as the input signals for the comparator are oriented on the low voltage side of the two flash EEPROM cells. This novel configuration makes it possible to read the overerased flash EEPROM cells used in this invention.

Figure 1:
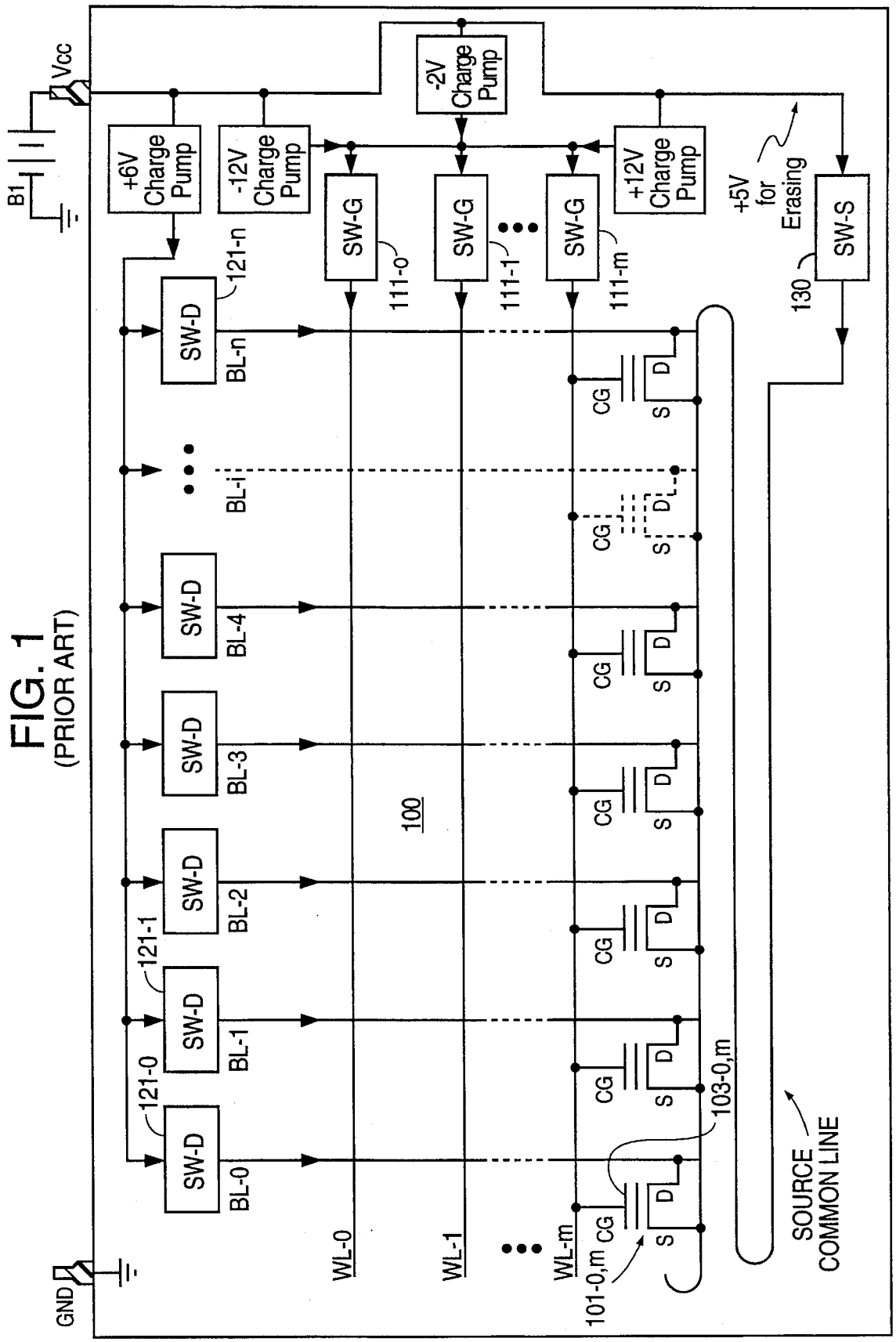
FIG. 1 is a block diagram of a prior art flash EEPROM array.
Figure 2:
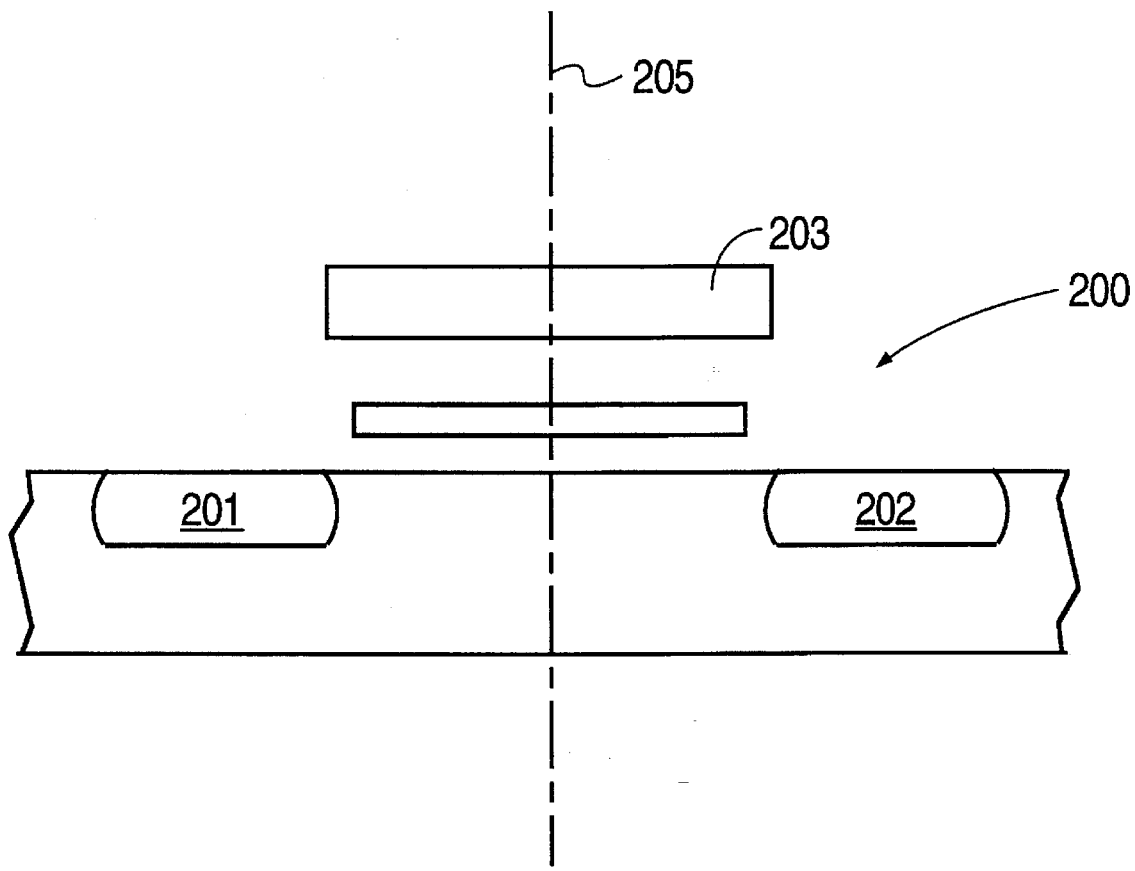
FIG. 2 is a cross sectional view of a prior art symmetrical flash EEPROM cell.

Herein, when a base reference numeral is used in the following description, the description is applicable to each of the components that have the base reference numeral in the drawings. When a particular component or feature is discussed, the base reference numeral is followed by a dash and a second reference character that identifies the particular component or feature from the other similar components or features that have the same reference numeral in the drawings.

DETAILED DESCRIPTION

According to the principles of this invention a high speed performance flash EEPROM array includes a plurality of flash EEPROM cells that are powered by a low power supply voltage $V_{CC}$. Herein, a "low power supply voltage $V_{CC}$" means a power supply voltage $V_{CC}$ in the range of about 2 volts to about 4 volts and preferably about 3 volts. As explained more completely below, this advance in performance is achieved by utilizing overerasure, a condition that was previously viewed as making a flash EEPROM cell inoperative. Specifically, the integrated circuit of this invention includes, as described more completely below, a flash EEPROM array, and overerasure circuit means, operatively connected to each flash EEPROM cell in the flash EEPROM array, that selectively overerases each row of flash EEPROM cells. This embodiment also includes a reading circuit means and a programming circuit means for the overerased flash EEPROM cells.

Thus, unlike the prior art flash EEPROM arrays that considered an overerased flash EEPROM cell as a failure, according to the principles of this invention, all the unprogrammed flash EEPROM cells in the array are operated in an overerased condition. As explained more completely below, the overerasure of the flash EEPROM cells, sometimes referred to as "cells," makes it possible to use a low power supply voltage and achieve a speed performance of 100 nanoseconds or better.

Figure 3:
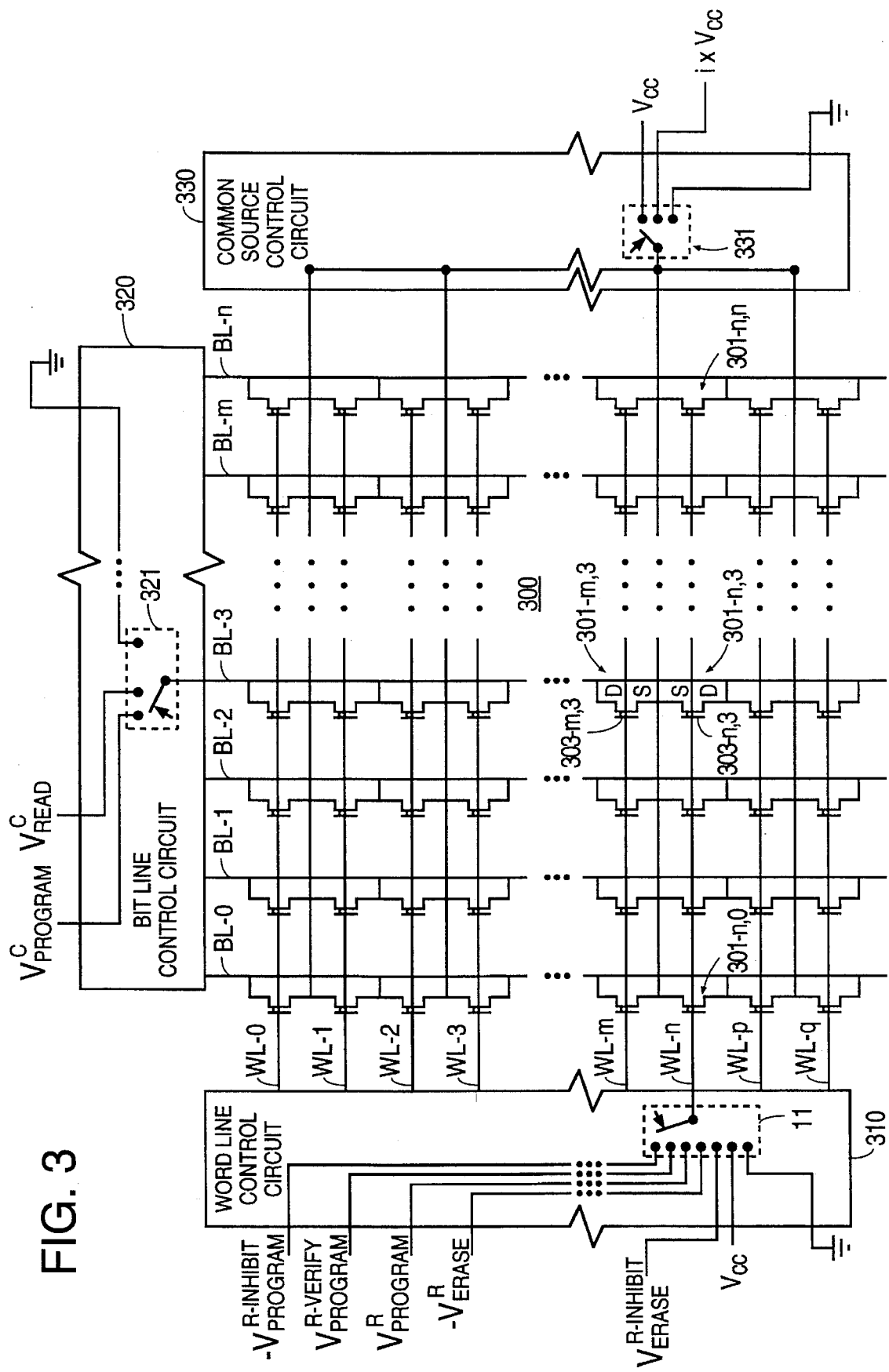
FIG. 3 is a conceptual schematic diagram of the flash EEPROM array architecture of this invention with a circuit means that overerases each flash EEPROM cell.

One embodiment of a flash EEPROM array 300 of this invention is illustrated in FIG. 3. Flash EEPROM array 300 includes a plurality of flash EEPROM cells 301. Typically, flash EEPROM array 300 includes a large number of flash EEPROM cells 301, e.g., one million or 100 million flash EEPROM cells. Flash EEPROM cells 301 are arranged preferably in rows and columns.

Flash EEPROM cell 301-n,3 is typical of each flash EEPROM cell in array 300. Flash EEPROM cell 301-n,3 includes a control gate 303-n,3 that is connected to a word line WL-n, a drain D that is connected to a bit line BL-3, a floating gate, and a source S that is tied to each of the other sources in array 300. Word line WL-n is connected to the control gate of each flash EEPROM cell 301 in the nth row of array 300, which is sometimes referred to as "row n". Similarly, bit line BL-3 is connected to each flash EEPROM cell 301 in the third column of array 300, which is sometimes referred to as "column 3". In this embodiment, flash EEPROM cells 301 are arranged in a "wired OR" configuration.

As used herein, "source S" and "drain D" are used to indicate only a particular location in the drawings and are not used to depict the electrical biasing of the flash EEPROM cell. As explained more, completely below, a larger potential in some circumstances is applied to source S than to drain D. Therefore, electrically, source S becomes the drain of the flash EEPROM cell and drain D becomes the source of the flash EEPROM cell.

Each word line WL is connected to word line control circuit 310 that includes row address circuitry as well as circuitry to selectively connect and disconnect each of a plurality of voltages, e.g., voltages $V_{READ}^{R}$, $V_{READ}^{R-INHIBIT}$, $V_{PROGRAM}^{R}$, $-V_{PROGRAM}^{R-INHIBIT}$, $V_{PROGRAM}^{R-VERIFY}$, $-V_{ERASE}^{R}$, and $V_{ERASE}^{R-INHIBIT}$, to each word line WL FIG. 3, voltage $V_{READ}^{R-INHIBIT}$ is the ground potential and voltage $V_{READ}^{R}$ is power supply voltage $V_{CC}$. Switch 311, which selectively disconnects and connects word line WL-n to each of the plurality of word line voltage sources, is illustrative of the function performed by word line control circuit 310 for each word line WL in switching the various voltages onto a particular word line. The row address circuitry is equivalent to the circuitry used with prior art flash EEPROM arrays and so is well-known those skilled in the art.

Each bit line BL is connected to bit line control circuit 320 that includes sense amplifiers, and column address circuitry as well as circuitry to selectively connect and disconnect each of a plurality of voltages, e.g., voltages $V_{PROGRAM}^{C}$, $V_{PROGRAM}^{C-INHIBIT}$, $V_{READ}^{C}$ and $V_{READ}^{C-INHIBIT}$, to each bit line BL as well as to float each bit line. In FIG. 3, voltage $V_{PROGRAM}^{C-INHIBIT}$ is represented by the ground potential and voltage $V_{READ}^{C-INHIBIT}$ is a float condition. Switch 321, which selectively disconnects and connects bit line BL-3 to each of the plurality of bit line voltage sources and floats bit line BL-3, is illustrative of the function performed by bit line control circuit 320 for each bit line BL in switching various voltage sources onto a particular bit line. The column address circuitry is the equivalent to the circuitry used with prior art flash EEPROM arrays and so is well-known to those skilled in the art. The overerasure of the flash EEPROM cells in flash EEPROM array 300 with the low power supply voltage requires novel sense amplifiers, which are described more completely below.

Each source S of each flash EEPROM cell 301 is tied to common source control circuit 330 that includes circuitry to ground and to apply power supply voltage $V_{CC}$, or a multiple thereof, to the tied sources. Switch 331 illustrates the function performed by common source control circuit 330. Preferably, the substrate of flash EEPROM array 300 is grounded.

In one embodiment, each flash EEPROM cell 301 is asymmetric with a double diffused source and is made using 0.85 micron feature design rules. The channel length is about 0.6 micrometers (μm). The source and drain diffusions are about 0.25 μm deep after a high temperature drive in, above 900° C., of a $7 \times 10^{15}$ ions/cm$^2$ implant. A source phosphorous diffusion is about 0.5 μm deep after a high temperature drive in, above 900° C., of a $1 \times 10^{14}$ ions/cm$^2$ to a $1 \times 10^{15}$ ions/cm$^2$ implant. Of course, if a symmetric flash EEPROM cell is desired, this phosphorous diffusion may be eliminated. Also, herein "deep" refers to the distance into the substrate from the surface of the substrate. The channel implant is about $1 \times 10^{13}$ ions/cm$^2$. The oxide layer between the substrate and the floating gate is less than 120 Å thick, and typically about 100 Å thick. The dielectric layer an oxide nitride oxide sandwich (ONO) separating the control gate and the floating gate is equivalent to about 250 Å thick oxide. The polysilicon floating gate has a phosphorous concentration of about $5 \times 10^{19}$ ions/cm$^2$ while the control gate is degenerately doped with phosphorous.

In the prior art EEPROM array architecture, each flash EEPROM cell was erased to a level near the "UV erased cell threshold voltage," which is the flash EEPROM cell threshold voltage when the floating gate does not carry any charge. The threshold voltage required to turn on the flash EEPROM cell with the floating gate neutral is taken as the reference threshold voltage. If the flash EEPROM cell is undererased so that the floating gate carries a negative charge, a voltage greater than the reference threshold voltage is required and so the flash EEPROM cell is said to have a "positive delta threshold voltage" with respect to a UV erased cell threshold voltage.

Conversely, if the flash EEPROM cell is overerased so that the floating gate effectively has a positive charge, a voltage less than the reference threshold voltage is required and so the flash EEPROM cell is said to have "a negative delta threshold voltage." According to the principles of this invention, the low voltage flash EEPROM array architecture includes an overerasure circuit means for configuring the flash EEPROM cells so that the cells have a negative delta threshold voltage, which is a condition that was previously considered undesirable.

The overerasure of flash EEPROM cells 301, which is an important aspect of this invention, is achieved by the erase architecture and operation of this invention, as described more completely below. The term "over-erase" refers to a threshold voltage level (as measured from the control gate) which is less than zero, i.e., the negative delta threshold voltage described above. This is usually achieved by applying an electric field across the tunnel oxide of a flash EEPROM cell for a selected period of time. The change in flash EEPROM cell threshold voltage with time is an exponential function of the electric field applied across the tunnel dielectric. As the flash EEPROM cell erases, the floating gate potential is raised, thus lowering the electric field. Either increasing the erase time at a fixed electric field, or increasing the electric field with a fixed erase time achieves the "over-erase" effect. Initially, each flash EEPROM cell 301 is overerased to a negative delta threshold voltage by an overerasure circuit means, as described below. Subsequently, the overerasure circuit means erases each flash EEPROM cell 301 in a row of flash EEPROM cells to a negative delta threshold voltage each time a row of array 300 is erased.

With a power supply voltage $V_{CC}$ of 3 volts and flash EEPROM cells 301 erased to a negative delta threshold voltage, array 300 has a 100 nanosecond or better speed performance and the negative delta threshold voltage effectively reduces the control gate voltage required to read a flash EEPROM cell. The combination of the negative delta threshold voltage and the low control gate voltage generates a current in the flash EEPROM cell equivalent to that obtained in prior art architectures with a larger control gate voltage. This is because the conductance (current) of an MOS device is a function of both the threshold voltage and the gate-to-source potential difference.

In the case of a floating gate device, such as the flash EEPROM cell described herein, the floating gate potential is the sum of the charge injected onto the floating gate by the program/erase mechanism and the voltage coupled to the floating gate from the control gate through the polysilicon-to-polysilicon dielectric. Overerasing a flash EEPROM cell injects positive charge onto the floating gate. This positive charge, if sufficiently great, can cause the flash EEPROM cell to conduct even if the control gate-to-source voltage is negative. Using this principle, a floating gate potential equivalent to that of the prior art is achieved by injecting positive charge onto the floating gate and lowering the control gate potential. Therefore, the speed performance of array 300 of this invention is equivalent to prior art flash EEPROM arrays even though the power supply voltage for array 300 of this invention is less than the power supply voltage for the prior art array with the equivalent speed performance.

Since flash EEPROM cells 301 of array 300 are overerased, the architecture of this invention, as described more completely below, prevents leakage between flash EEPROM cells 301 during reading and programming of flash EEPROM cells 301. In the case of the read operation, if no word line or bit line is selected, the word line potential is zero volts. The bit line potential floats or is pulled up to the minimum threshold voltage (Vt) of the flash EEPROM cells on the bit line (i.e. if the minimum threshold voltage (Vt) of flash EEPROM cells on the bit line is −2 V, the bit line is pulled up to 2 V.), because the control gate-to-source voltage is less than zero.

Figure 4:
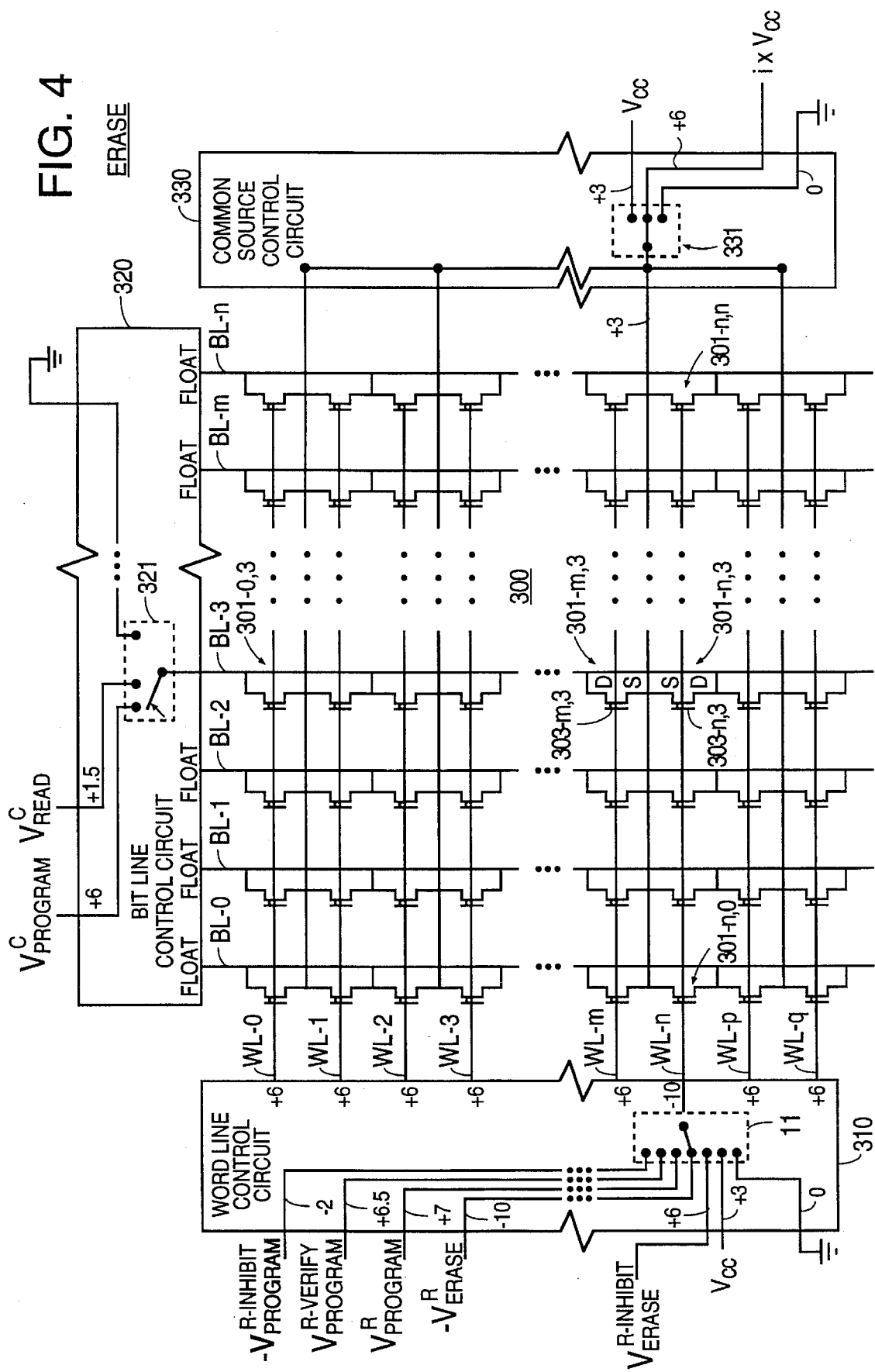
FIG. 4 is a conceptual schematic diagram showing the configuration of the flash EEPROM array architecture of this invention for a three volt power supply voltage and overerasure of the flash EEPROM cells in row n of the array.
Figure 5:
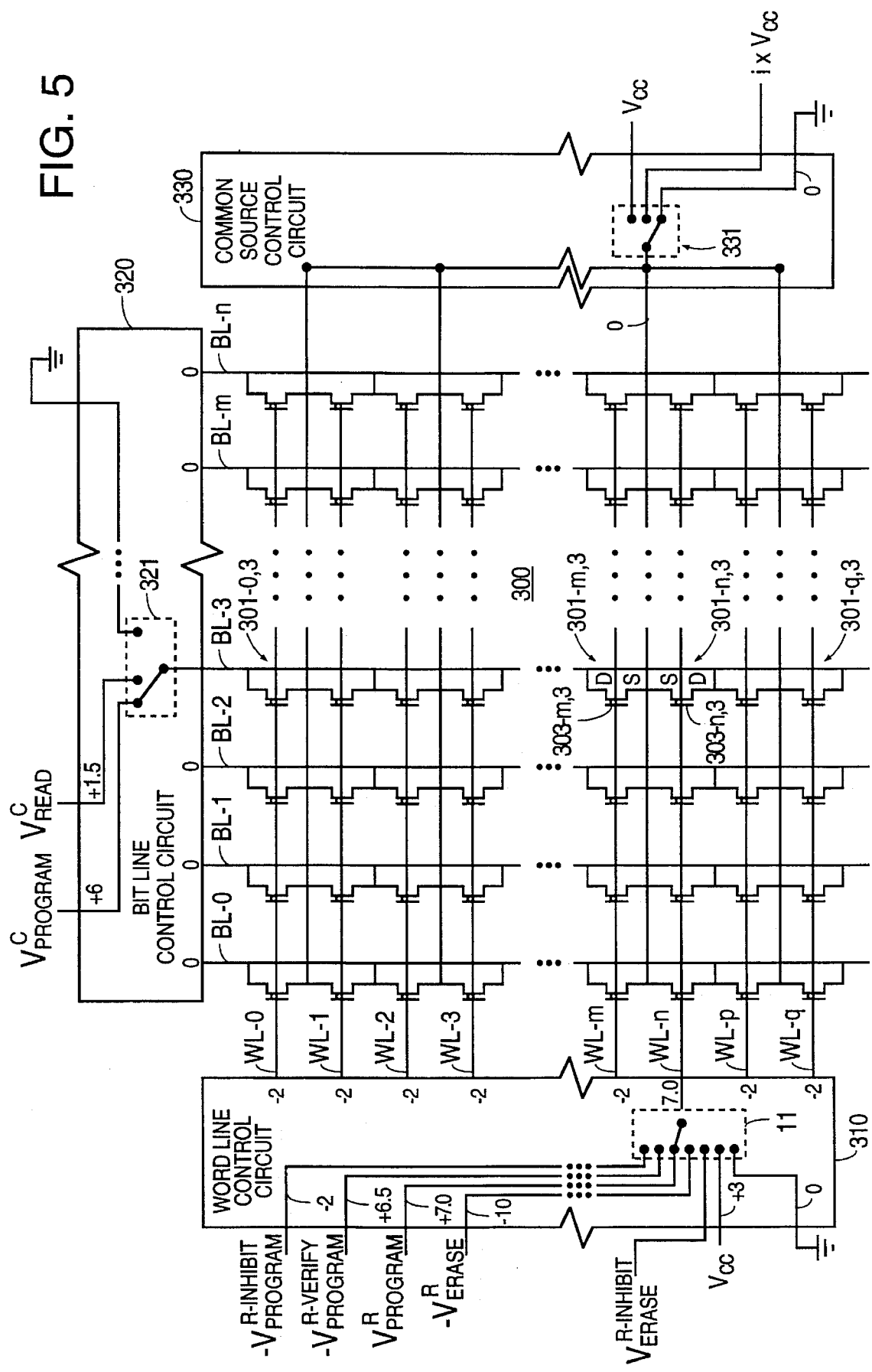
FIG. 5 is a conceptual schematic diagram of one embodiment of the flash EEPROM array architecture of this invention for a program operation with a three volt power supply voltage and overerased flash EEPROM cells.
Figure 6:
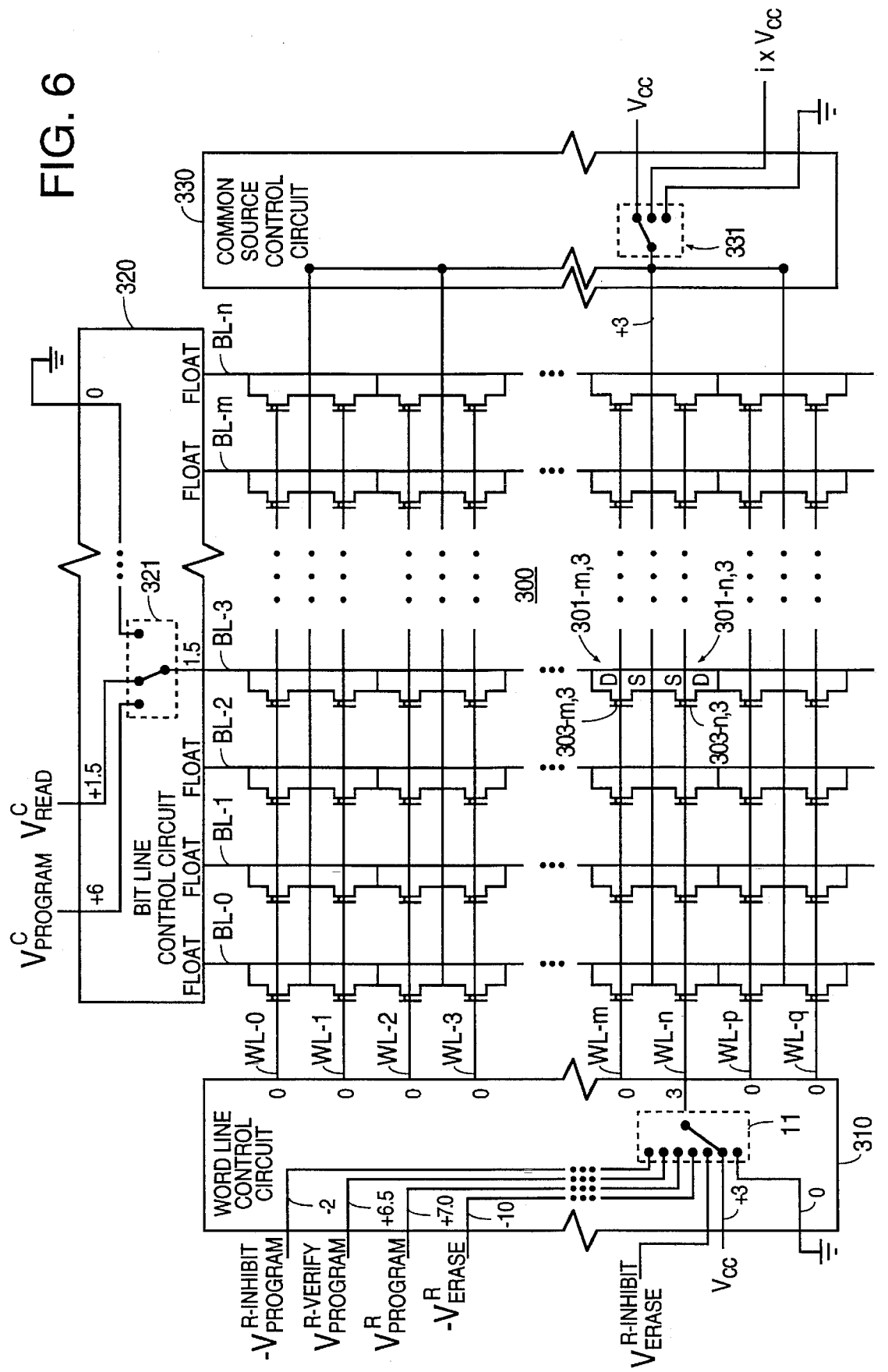
FIG. 6 is a conceptual schematic diagram of one embodiment of the flash EEPROM array architecture of this invention for a read operation with a three volt power supply voltage and overerased flash EEPROM cells.

One embodiment of the overerasure circuit means of flash EEPROM array 300 is illustrated in FIG. 4. In FIG. 4, the voltage applied to each word line WL by word line control circuit 310 is given within circuit 310 at the end of the word line. Similarly, the voltage applied to each bit line BL by bit line control circuit 320 is given within circuit 320 at the end of the bit lines. (A similar convention is used in FIGS. 5 and 6). Means for switching one voltage from a plurality of voltages onto a particular line are well-known to those skilled in the art. For example, each word line could be selectively connected and disconnected to the plurality of word line voltages by a programmable multiplexer.

Specifically, in this embodiment, to overerase row n i.e., flash EEPROM cells 301-n,0 to 301-n,n, of array 300, bit lines BL-0 through BL-n are floated by the switch circuitry in bit line control circuit 320. Switch 321 illustrates this function for bit line BL-3. Common source control circuit 330 applies power supply voltage $V_{CC}$ or higher, e.g. about three to about six volts, to all the sources in array 300. Thus, in FIG. 4, switch 331 is connected to voltage level $V_{CC} * i$, where, in this embodiment, i=1, 2. Of course, the value of "i" is not limited to integer values.

Word lines WL-0 through WL-m and word lines WL-p and WL-q are connected by word line control circuit 310 to the same potential as the common source line, i.e., voltage $V_{ERASE}^{R-INHIBIT}$. The application of this potential to word lines WL-0 to WL-m and WL-p to WL-q acts as an erase inhibit for these word lines. Thus, in this embodiment, voltage $V_{ERASE}^{R-INHIBIT}$ is the same voltage used for the common source voltage in common source control circuit 330.

This configuration of voltages allows the flash EEPROM cells connected to a single word line e.g., word line WL-n within array 300 to be overerased while not disturbing the contents of the remaining rows within array 300. Word line control circuit 310 via switch 311 switches voltage $-V_{ERASE}^R$, e.g., $-10$ volts, to word line WL-n for about several hundred milliseconds, typically 200 to 300 milliseconds to overerase flash EEPROM cells 301-n,0 to 301-n,n in row n of array 300.

In some cases it may be desirable to ground the unselected word lines. To maintain the same voltage as on the common sources, the common sources should also be grounded. However, if the unselected word lines are grounded and the common source voltage is, for example, power supply voltage $V_{CC}$ there is a potential difference between the unselected common source line and the unselected word lines. The potential difference may cause a slow erase to occur. This slow erase may result in eventual data loss of programmed cells. The greater the potential difference between the control gate and the common source, the more rapid the disturb of the programmed cell data. The array of this invention could be operated with such a potential difference provided that the array is either configured or operated such that the potential loss of programmed data does not affect operation of the array.

Alternatively, partitioning the array into subsections such that there are several common source lines within the array allows sections of the array to be in erase inhibit with both the unselected word lines and the common source line at a zero volt potential while another section of the array may have the common source line and the unselected word lines at power supply voltage $V_{CC}$ or higher, for the erase operation in that section.

The negative potential of preferably about $-10$ V applied to the word line of the row being overerased for a selected period of time is an important aspect of this invention. In the prior art flash EEPROM arrays with a negative gate erasure, a potential of about $-10.5$ volts was applied to the word line only for a time sufficient to bring the flash EEPROM cell to the UV threshold voltage. In contrast to the prior art flash EEPROM arrays, the flash EEPROM cells of array 300 of this invention are overerased with the $-10$ V so that the floating gate has a positive potential. This positive potential configures the flash EEPROM cell so that a read may be accomplished very rapidly with only a low power supply voltage $V_{CC}$ of three volts, for example. Of course, the negative voltage used to overerase the flash EEPROM cells may be different for different flash EEPROM cells. The important aspect is that the flash EEPROM architecture include an overerasure circuit means that overerases the flash EEPROM cells.

In general, over erasing cells requires more time than the prior art erase. Since the erase time of a flash EEPROM cell by Fowler Nordheim tunneling is an exponential function of the electric field presented across the first gate dielectric (tunnel oxide), increasing the electrical potential across the dielectric or physically reducing the effective dielectric thickness reduces the erase time. Physically, reducing the effective dielectric may result in degraded oxide quality.

Using a power supply voltage of $V_{CC}$ three volts on the common source during erase results in a longer erase time for the prior art EEPROM cell operation relative to the normal erase time for such a cell. Using three volts on the common source during overerase will result in a still longer erase time. To partially compensate for this longer erase time, one embodiment of this invention uses a potential higher than power supply voltage $V_{CC}$ on the common source line. The higher potential may be derived from the same charge pump used to increase the bit line voltage during programming operation. Such a power supply must have sufficient current capability to support band-to-band tunneling.

After a row is overerased, each flash EEPROM cell in the row is verified as overerased. Erase verify is achieved by the same sensing methods as in a read operation. Methods to guarantee proper erase margin are achieved by either reducing the word line and reference flash EEPROM cell control gate voltage to less than power supply voltage $V_{CC}$ and using a sense ratio greater than one (FIG. 7A), or increasing the gate voltage of the reference flash EEPROM cell with respect to the word line while maintaining the word line potential at power supply voltage $V_{CC}$ and maintaining a sense ratio of one. (FIG. 7A) Both methods of margining, i.e., a sense ratio of one and a sense ratio greater than one, are in common practice by those skilled in the art. Therefore, in view of this knowledge, and the more detailed description given below of the novel sense circuitry for a sense ratio greater than one, the basic principles of operation of the circuits in both FIG. 7A and 7B will be apparent to those skilled in the art.

Figure 7A:
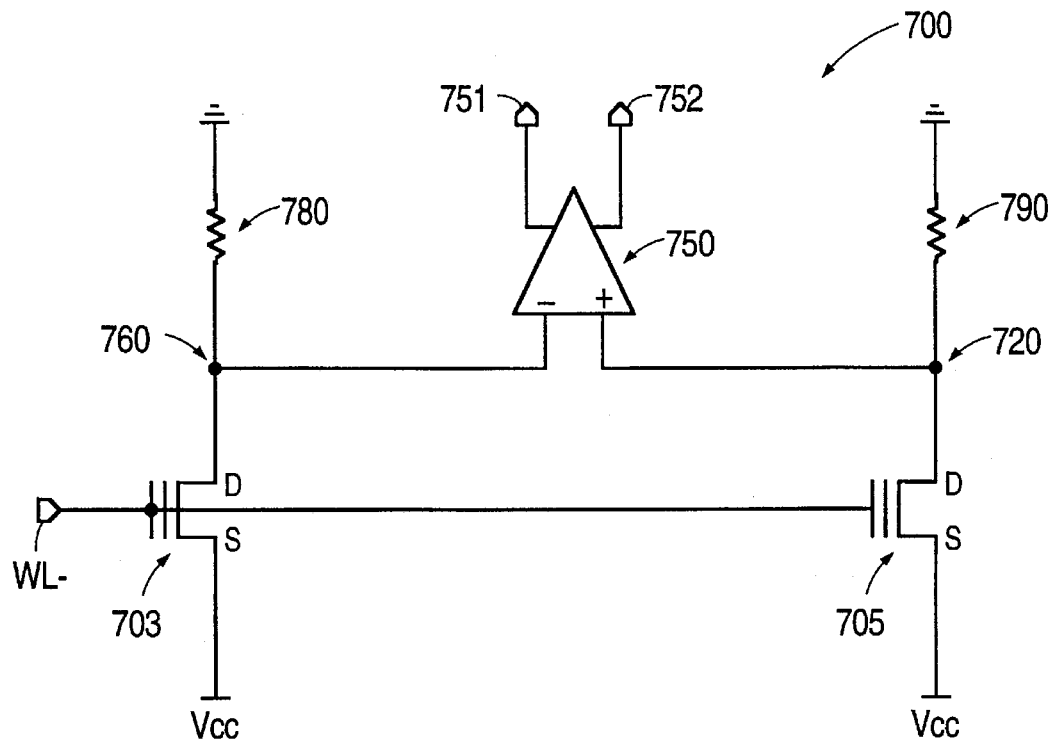
FIG. 7A is a conceptual schematic diagram of the sense circuit of this invention for a flash EEPROM array with overerased flash EEPROM cells for a sense ratio N greater than one.

FIG. 7A illustrates a typical sensing circuit for a sense ratio greater than one. The sense ratio is defined as the ratio of the resistance of resistor 780 to resistance of resistor 790, where cell 705 is the reference cell(s).

Hence, according to the principles of this invention, the structure of this invention includes an overerasure circuit means that overerases each of the flash EEPROM cells in the array to a negative delta threshold voltage thereby placing the flash EEPROM cells in an overerased condition. As described above, the overerasure circuit means, in this embodiment, includes: (i) switch means within bit line control circuit 320 that floats each bit line of n bit lines; (ii) switch means, within word line control circuit 310 that selectively applies a negative voltage $-V_{ERASE}^R$ sufficient to overerase the flash EEPROM cells in a row onto any one selected word line of q word lines and that applies a voltage $V_{ERASE}^{R-INHIBIT}$ onto any (q-1) of q word lines; and (iii) switch means within common source control circuit 330 that applies voltage $V_{ERASE}^{R-INHIBIT}$ onto the sources of all or any portion therein of flash EEPROM cells 301 in array 300; and (iv) means for grounding the substrate of the flash EEPROM array.

In another embodiment, the overerasure circuit means includes switch means within bit line control circuit 320 for switching zero volts onto each bit line in place of floating bit lines as in the above embodiment. All other features in this embodiment are identical to those just described. While floating the bit line is sufficient to achieve the flash EEPROM cell overerasure, in some circumstances floating the bit lines is undesirable and so each bit line is grounded.

Programming of a flash EEPROM cell, for example, flash EEPROM cell 301-n,3 (FIG. 5) in flash EEPROM array 300 is achieved, in this embodiment, via channel hot electron programming. Programming overerased flash EEPROM cell 301-n,3 requires a reduced gate voltage in comparison to the gate voltage required to program a conventional prior art flash EEPROM cell, because the negative delta threshold created by the overerasure effectively increases the floating gate potential.

Therefore, in contrast to the conventional flash EEPROM array architecture that typically required about 10 volts to program a flash EEPROM cell, according to the principles of this invention voltage $V_{PROGRAM}^R$ applied to the word line for programming is about 7.5 volts to about 7 volts. Since the word line voltage applied in the read mode is less than the prior art, e.g., three volts vs. five volts, the programmed flash EEPROM cell threshold is not required to be as great. All that is required is that the difference in flash EEPROM cell threshold between the programmed and erased states remain similar to the prior art.

In the case of the prior art, the UV flash EEPROM cell threshold was approximately 2 volts, and the electrically erased flash EEPROM cell threshold was perhaps 2.5 volts. The programmed flash EEPROM cell threshold was perhaps 5 volts resulting in a threshold difference between the programmed and erased states of 2.5 volts.

According to the principles of this invention, the electrically erased flash EEPROM cell threshold is near −2 volts. Thus, to maintain about the same threshold difference between the programmed and erased states as required for the prior art, a programmed flash EEPROM cell threshold for this invention is about +0.5 volts. As with the prior art, proper sensing of a programmed flash EEPROM cell does not require that the flash EEPROM cell not conduct (i.e. to be turned off with 3 volts on the word line).

In one embodiment, to program a flash EEPROM cell, for example, flash EEPROM cell 301-n,3 of array 300 (FIG. 5) bit lines BL-0 through BL-2 and BL-4 (not shown) to BL-n are grounded by the switch circuitry in bit line control circuit 320, i.e., column program inhibit voltage $V_{PROGRAM}^{C\text{-}INHIBIT}$ is switched onto bit lines BL-0 through BL-2 and BL-4 (not shown) to BL-n. Column program voltage $V_{PROGRAM}^C$ of approximately six volts is switched by switch 321 onto bit line BL-3. Common source control circuit 330 grounds all the sources in array 300 and the substrate is also grounded.

Word line control circuit 310 switches the row program inhibit voltage $-V_{PROGRAM}^{R\text{-}INHIBIT}$ of approximately −2 volts onto word lines WL-0 through WL-m and Word lines WL-p and WL-q. Word line control circuit 310 sets switch 311 so that row program voltage $V_{PROGRAM}^R$, e.g., 7.0 volts, is applied on word line WL-n for about ten microseconds so that the floating gate of flash EEPROM cell 301-n,3 is programmed by hot electron ejection as flash EEPROM cell 301-n,3 turns on and conducts between source S and drain D. Specifically, the negative delta threshold voltage of overerased flash EEPROM cell 301-n,3 in combination with row program voltage $V_{PROGRAM}^R$ turns on flash EEPROM cell 301-n,3 and the approximately six volt difference between drain D and source S is sufficient to produce hot electrons that are injected into the floating gate of flash EEPROM cell 301-n,3.

To assure that no leakage currents are generated in columns BL-0 to BL-2 and BL-4 to BL-n during programming of flash EEPROM cell 301-n,3, all word lines WL-0 to WL-m, WL-p and WL-q except word line WL-n for the nth row are held at a negative potential thereby offsetting the positive potential on the floating gate created by the overerased condition.

Specifically, in one embodiment flash EEPROM cells in columns BL-0 through BL-n except for column BL-3 have zero volts potential on both source S and drain D. The common potential on both source S and drain D acts as a program inhibit for unselected columns with −2 volts on the word line since there is no channel current to generate the hot channel electrons required for programming. Tunneling effects are similar to those observed in prior art. Similarly, a program inhibit also exists for cells in column BL-3 with word lines at a negative potential while the drain potential of these cells is approximately 6 V. In addition, the cells in row WL-n with seven volts on the control gate and zero potential on both source S and drain D are inhibited because again there is no channel current to generate the hot channel electrons required for programming.

Thus, an important aspect is that the unselected bit lines and the Common source lines are held at a common potential so that no hot channel electrons are generated. The other important aspect is that the unselected word lines are held at a potential such that the unselected cells, in the column having the bit line at the program voltage, remain turned off.

The approximately 10 microseconds required to program flash EEPROM cell 301-n,3 is a relatively long time and so a charge pump can be used to generate the −2 volts used as the row inhibit voltage on the unselected word lines. The time constant defined by the charge pump output impedance and the word line capacitance of array 300 is easily addressed by the charge pump design parameters such that the several microsecond programming time is not an issue.

Hence, according to the principles of this invention, the structure of this invention includes a program circuit means that can program each of the overerased flash EEPROM cells without interference by the other overerased flash EEPROM cells in the array. As described above, the program circuit means, in this embodiment includes: (i) switch means within bit line control circuit 320 that selectively switches the column program inhibit voltage $V_{PROGRAM}^{C\text{-}INHIBIT}$ onto any (n−1) of n bit lines and that selectively switches a column program voltage $V_{PROGRAM}^C$ onto any one of n bit lines; (ii) switch means within word line control circuit 310 that selectively switches a row program inhibit voltage $V_{PROGRAM}^{R\text{-}INHIBIT}$ onto any (q−1) of q word lines, and that selectively switches a row program voltage $V_{PROGRAM}^R$ onto any one of q word lines; (iii) switch means in common source control circuit 330 that holds the sources of all flash EEPROM cells 301 in array 300 at voltage $V_{PROGRAM}^{C\text{-}INHIBIT}$; and (iv) means for grounding the substrate of array 300.

In the embodiment described above and illustrated in FIG. 5, the column program inhibit voltage $V_{PROGRAM}^{C\text{-}INHIBIT}$, sometimes called the bit line program inhibit voltage was zero volts. In another embodiment, the bit lines for the columns that are not being programmed are floated.

Figure 7B:
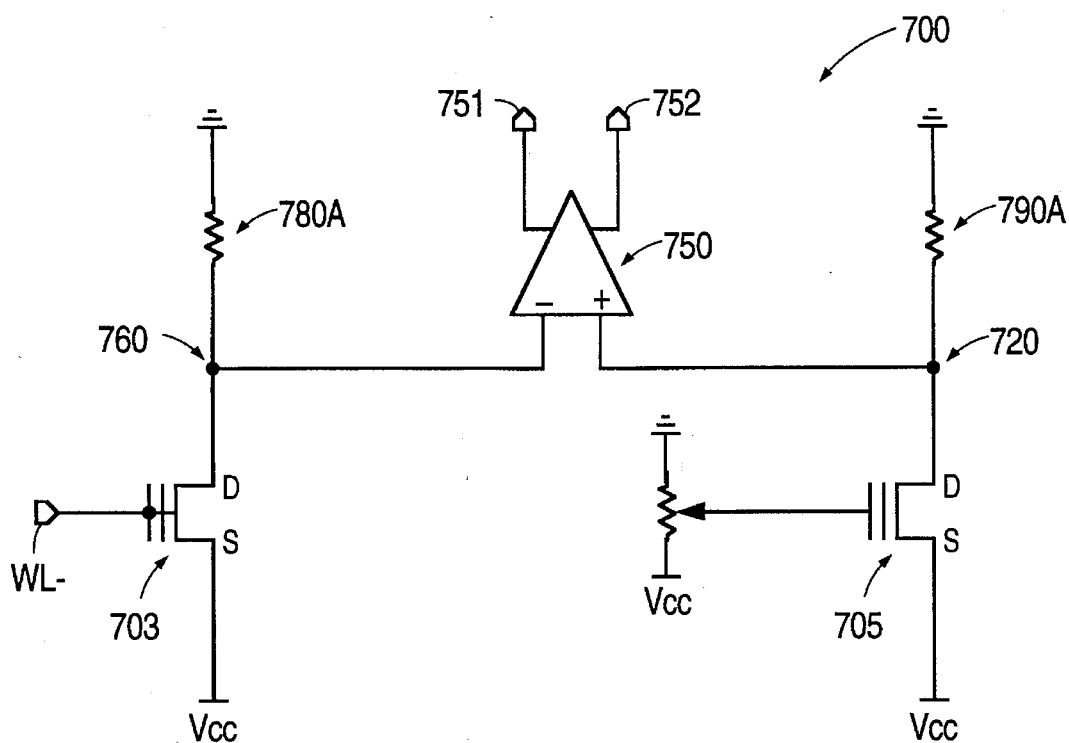
FIG. 7B is a conceptual schematic diagram of the sense circuit of this invention for a flash EEPROM array with overerased flash EEPROM cells for a sense ratio N equal to one.

Program verify, like erase verify, may be achieved by two methods. Methods to guarantee proper program margins are achieved by either increasing the word line and reference flash EEPROM cell control gate voltage to greater than voltage $V_{CC}$ and using a sense ratio greater than one (FIG. 7A), or decreasing the control gate voltage of the reference flash EEPROM cell with respect to the word line while maintaining the word line potential at voltage $V_{CC}$ and maintaining a sense ratio of one (FIG. 7B). (However, if the method of increasing the word line voltage to greater than power supply voltage $V_{CC}$ is chosen, the unselected word lines must be set to −2 volts as in the case of programming to prevent leakage resulting from other intentionally over-erased flash EEPROM cells on the same bit line.)

To read flash EEPROM cell 301-n,3 of array 300 (FIG. 6) bit lines BL-0 through BL-2 and BL-4 (not shown) to BL-n are floated by the switch circuitry in bit line control circuit 320, i.e., column read inhibit voltage $V_{READ}^{C-INHIBIT}$ is switched onto bit lines BL-0 through BL-2 and BL-4 (not shown) to BL-n. Column read voltage $V_{READ}^{C}$ of 1.5 volts, in this embodiment, is switched onto bit line BL-3 by switch 321. Common source control circuit 330 switches power supply voltage $V_{CC}$ onto all the sources in array 300. The substrate is grounded.

Word line control circuit 310 switches row read inhibit voltage $V_{READ}^{R-INHIBIT}$ of zero volts onto word lines WL-0 through WL-m and word lines WL-p and WL-q, i.e., these word lines are grounded. Word line control circuit 310 switches row read voltage $V_{READ}^{R}$, which is power supply voltage $V_{CC}$ in this embodiment, onto word line WL-n. This configuration reverse biases flash EEPROM cell 301-n,3 from its normal configuration so that current flows from source S to drain D, i.e. to the bit line from the source as opposed to from the bit line to the source as in the prior art array.

Even though the other flash EEPROM cells in array 300 are overerased, there is no leakage between the flash EEPROM cells connected to bit line BL-3 in column 3, because all other flash EEPROM cells in the column have a zero voltage on the control gate and voltage $V_{READ}^{C}$ of approximately 1.5 Volts on bit line BL-3 so that the flash EEPROM cells are not turned on. Bit line voltage $V_{READ}^{C}$ provides electrical source bias to all unselected cells in column 3. This source bias enhances the body effect and thereby increases the threshold voltage of the unselected cells in column 3. The combination of the control gate grounded (at zero volts) and the electrical source potential of the cell at approximately 1.5 V turns off all unselected cells in column 3.

Hence, according to the principles of this invention, the structure of this invention includes a read circuit means that can read each of the overerased flash EEPROM cells without interference by the other overerased flash EEPROM cells in the array. As described above, in this embodiment, the read circuit means includes: (i) switch means within bit line control circuit 320 that selectively switches a column read inhibit voltage $V_{READ}^{C-INHIBIT}$ onto any (n−1) of n bit lines, and that selectively switches a column read voltage $V_{READ}^{C}$ onto any one of n bit lines; (ii) switch means within word line control circuit 310 that selectively connects any (q−1) of q bit lines to ground i.e., applies a row read inhibit voltage $V_{READ}^{R-INHIBIT}$, and that selectively switches a row read voltage $V_{READ}^{R}$ onto any one of q word lines; (iii) switch means within common source control circuit 330, that connects the sources of all flash EEPROM cells 301 in array 300 to power supply voltage $V_{CC}$; and (iv) means for grounding the substrate of array 300.

In the read operation, a negative voltage is not utilized. This approach is highly preferable to using a negative word line voltage for the read operation. The generation of a negative word line voltage for the read operation would require a negative power supply capable of switching the word line voltage very rapidly so as to achieve the desired 100 nanosecond or better speed performance. Such a power supply would require considerable die area and power, neither of which are desirable. Accordingly, the architecture of this invention preferably utilizes a read process that does not require the use of a negative voltage.

Table 2 is a summary of the voltage applied to each bit line and word line in flash EEPROM array 300 for erase, programs and read operations. Various embodiments for the inhibit voltages are given.

TABLE 2

| Operation Mode | Word Line $V_G$ (Volts) | Bit Line $V_D$ (Volts) | Array Ground $V_S$ (Volts) |
|---|---|---|---|
| Read | $V_{CC}$ | 1.5 | $V_{CC}$ |
| Read Inhibit (B/L) | $V_{CC}$ | Float | $V_{CC}$ |
| Read Inhibit (W/L) | 0 | 1.5 | $V_{CC}$ |
| Read Inhibit (W/L) | 0 | Float | $V_{CC}$ |
| Program | 7 | $2*V_{CC}$ | 0 |
| Program Inhibit (B/L) | 7 | 0 | 0 |
| Program Inhibit (W/L) | −2 | 0 | 0 |
| Program Inhibit (B/L) | 7 | Float | 0 |
| Program Inhibit (W/L) | −2 | Float | 0 |
| Program Inhibit (W/L) | −2 | $2*V_{CC}$ | 0 |
| Erase | −10 | Float | $2*V_{CC}$ or $V_{CC}$ |
| Erase Inhibit | 0 | 0 | 0 |
| Erase Inhibit | 0 | Float | 0 |

(W/L) = word line
(B/L) = bit line

As explained above, source S of flash EEPROM cell 703 (FIG. 7A) electrically becomes the drain of flash EEPROM cell 703 and drain D electrically becomes the source of flash EEPROM cell 703 because a larger potential is applied in some circumstances to source S than to drain D. Further, flash EEPROM cell 703 is overerased so that flash EEPROM cell 703 has a negative delta threshold voltage. Accordingly, normal sense circuitry will not work with the flash EEPROM array architecture of this invention because such sense circuitry is designed to function with EEPROM cells that have a positive delta threshold voltage.

FIG. 7A is a conceptual diagram of a sense circuit 700 of this invention for a sense ratio greater than one. For simplicity, in FIG. 7A, only a single flash EEPROM cell 703, that is being read in a column of flash EEPROM cells, is illustrated. As will be appreciated by those skilled in the art, point 760 represents a data output line from column decode circuitry that is connected to the bit line of the column that includes flash EEPROM cell 603.

Since conventional column decode circuitry is well known to those skilled in the art and is not affected by the negative delta threshold voltage of this invention, the column decode circuitry has been eliminated for clarity. Thus, point 760 is shown as being connected directly to drain D of flash EEPROM cell 703. Power supply voltage $V_{CC}$, i.e., a first voltage level, is connected to source S of flash EEPROM cell 703, as described above. Array column 760 is connected by a first resistor 780 to a second voltage level, e.g., ground, which is less than said first voltage level. Point 760 is also connected to an inverting input terminal "–" of comparator 750. Word line WL-i is connected to the control gate of flash EEPROM cell 703. Word line WL-i is also connected to the control gate of reference flash EEPROM cell 705.

Reference flash EEPROM cell 705 is a flash EEPROM cell that is identical to flash EEPROM cell 703 and each of the other flash EEPROM cells in the array. Reference cell 705 is preferably electrically erased such that the cell threshold is less than the UV erased threshold which is the neutral state of cell (no net change on the floating gate). Source S of reference flash EEPROM cell 705 is connected to the first voltage level, e.g., power supply voltage $V_{CC}$, while drain D of reference flash EEPROM cell 705 is connected to reference point 770. Reference point 770 is connected to the second voltage level through a second resister 790 and to a non-inverting terminal "+" of comparator 750. Comparator 750 drives output lines 751 and 752 to output buffers (not shown).

An important aspect of the invention is that first and second resistors 780 and 790 as well as the input signals for comparator 750 are oriented on the low voltage side of flash EEPROM cells 703 and 705. Further, the resistance of first resistor 780 is preferably greater than the resistance of second resistor 790. As explained above, sense ratio N is the ratio of resistance of resistor 780 to the resistance of resistor 790. Equivalently, sense ratio N is defined by:

$$I_{cell} * N = I_{REF} \qquad (1)$$

where $I_{cell}$=current of cell 703

$I_{REF}$=current of cell 705

This is illustrated in a simplified example for both cells operating in the saturated condition, such that drain-to-source current $I_{DS}$ is reasonably approximately by:

$$I_{DS} = \beta(V_{gs} - V_t)^2 \qquad (2)$$

Using expression (2) on both sides of expression (1) gives:

$$[\beta(V_{GS} - V_{TA})^2]_{CELL} * N = [\beta(V_{GS} - V_{TR})^2]_{REF} \qquad (3)$$

where $\beta$=the gain of the transistor.

$V_{GS}$=the gate-to-source voltage of the transistor.

$V_{TA}$=the threshold voltage of the array flash EEPROM cell.

N=sense ratio.

$V_{TR}$=the threshold voltage for the reference flash EEPROM cell.

Flash EEPROM cell 703 and reference flash EEPROM cell 705 are effectively voltage dependent current sources connected to resistors 780 and 790, respectively.

In this embodiment, reference flash EEPROM cell 705 is erased and so is always conducting. Thus, flash EEPROM cell 705 provides a known reference voltage to comparator 750. The current through resistor 780 depends on whether flash EEPROM cell 703 is programmed or erased. The current through flash EEPROM cell 703 controls the voltage at point 760 which in turn controls the output signal generated by comparator 750. While resistors 780 and 790 can be implemented in a number of ways, in one embodiment, as explained more completely below, MOS transistors are effectively configured as resistors.

Since array column flash EEPROM cell 703 and reference flash EEPROM cell 705 are formed by the same process, the two flash EEPROM cells have about the same threshold voltage. Thus, if flash EEPROM cell 703 and 705 have the same control gate voltage and the same source-to-drain voltage, the two flash EEPROM cells conduct the same amount of current. However, when flash EEPROM cells 703 and 705 conduct the same amount of current, the voltage drop across resistor 780 and the voltage drop across resistor 790 are not the same, because the size of the resistors are different.

In this embodiment, resistor 790 on the reference side of sense circuit 700 has a resistance of R ohms and resistor 780 on the array side of the sense circuit 700 has a resistance of (N * R) ohms. The point at which the two voltages driving comparator 750 are equal is the threshold of sensing circuit 700. This threshold is determined by using the equation given above to define sense ratio "N".

In one embodiment of the novel sense circuitry of this invention, a sense pre-amplifier is inserted between the bit line decoder output line and the node connected to (i) the load resistor and (ii) the first input line to the comparator. A similar sense pre-amplifier is inserted between the reference flash EEPROM cell and the node connected to (i) the reference load resistor and (ii) the second input line to the comparator.

For example, inverted cascode pre-amplifier 865 is the sense pre-amplifier inserted between bit line decoder output line coupled to flash EEPROM cell 803 and node 860 connected to a first input line to comparator 850. In this embodiment, diode-connected N-channel MOS field effect transistor (MOSFET) 880 is used as the load instead of a resistor. The signal on the bit line decoder output line is applied to a source of a first P-channel MOSFET 861. The source of MOSFET 861 is tied to the substrate of MOSFET 861. The drain of MOSFET 861 is connected to node 860. MOSFET 861 is a single layer polysilicon P-channel MOSFET with about a 190 Å gate oxide. The source and drain diffusions are about 0.4 μm deep. The channel region of MOSFET 861 has a width of about 120 μm and a length of about 1.2 μm.

The gate of MOSFET 861 is driven by a signal from an inverting feedback amplifier formed by MOSFETs 862 and 863. MOSFET 862 is a second P-channel MOSFET with a source connected to power supply voltage $V_{CC}$ and a drain connected to the gate of MOSFET 861 and to the drain of intrinsic N-channel MOSFET 863. The source of MOSFET 863 is connected to ground. The gates of MOSFETs 862 and 863 are driven by the signal on the bit line decoder output line.

MOSFET 862 is a single layer polysilicon P-channel FET with about a 190 Å gate oxide. The source and drain diffusions are about 0.4 μm deep. The channel region of MOSFET 862 has a width of about 20 μm and a length of about 1.2 μm.

MOSFET 863 is a single layer intrinsic polysilicon N-channel FET with about a 190 Å gate oxide. The source and drain diffusions are about 0.4 μm deep. The channel region of MOSFET 863 has a width of about 4 μm and a length of about 1.6 μm.

Load transistor 880 is a single layer polysilicon N-channel MOSFET with about a 190 Å gate oxide. The source and drain diffusions are about 0.4 μm deep. The channel region of transistor 880 has a width of about 20 μm and a length of about 1.2 μm.

Recall that the electrical source of flash EEPROM cell 803 is connected to the bit line which in turn provides an input signal to cascode pre-amplifier 865 through the decoding circuitry. If the voltage level on the bit line were allowed to swing close to ground, e.g., one threshold above ground, flash EEPROM cell 803 would be overstressed. Furthermore a bit line potential too close to zero volts would not prevent leakage through other intentionally over-erased cells on the same bit line.

Cascode pre-amplifier 865 is designed to prevent the voltage level on the bit line from approaching ground. The signal from the bit line is the bias voltage for MOSFET 861. As this bias voltage increases, the output voltage of inverting feedback amplifier consisting of MOSFETs 862 and 863 to the gate of MOSFET 861 decreases and consequently the conductance of MOSFET 861 increases. Thus, the feedback amplifier stabilizes the input signal to comparator 850 such that the voltage level seen by the electrical source of flash EEPROM cell 803 is more than one threshold above ground.

Cascode pre-amplifier 875 for reference flash EEPROM cell 805 is constructed in a matter identical to that described for cascode pre-amplifier 865 and operates in a matter identical to that described for cascode pre-amplifier 865. However, the load for reference flash EEPROM cell 805 in this embodiment is four diode-connected N-channel MOSFETs 891 to 894 connected in parallel. N-channel MOSFETs 891 to 894 are each preferably identical to MOSFET 880.

Figure 8:
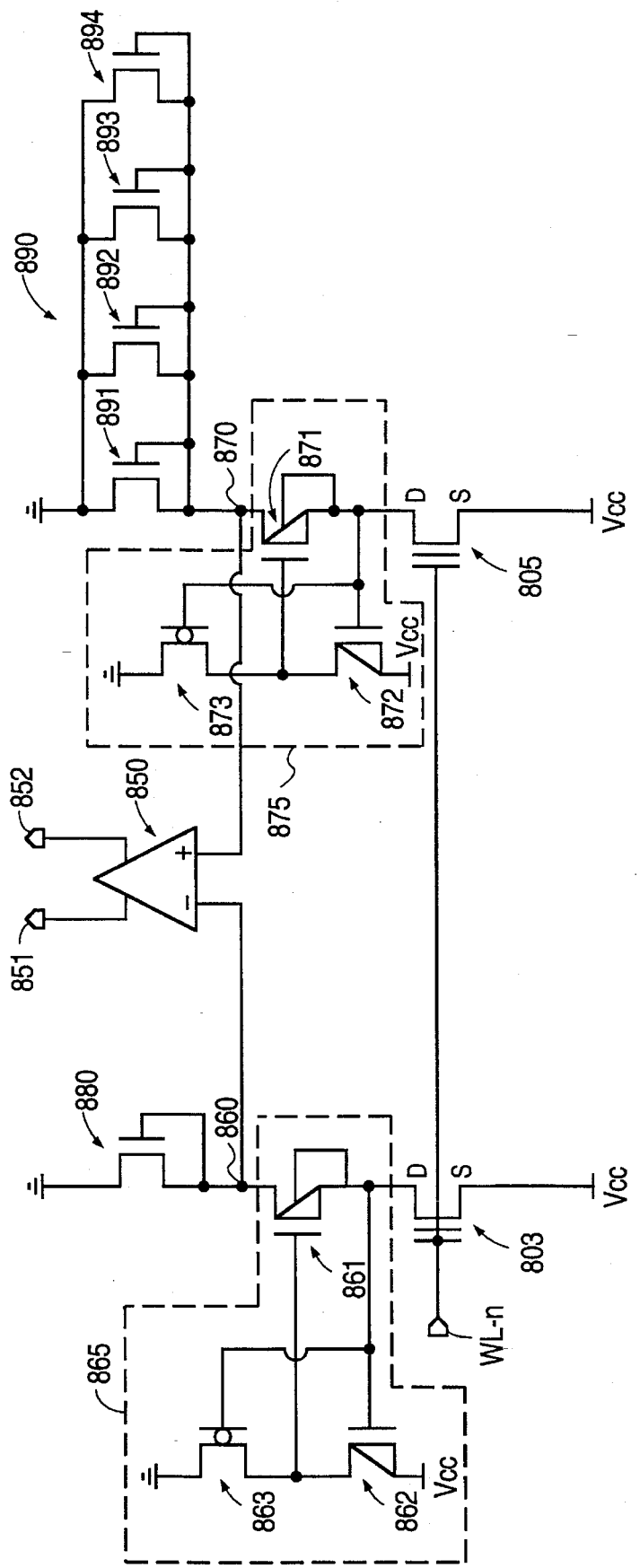
FIG. 8 is a schematic diagram of the sense circuit of this invention that includes a cascode preamplifier for a flash EEPROM array with overerased flash EEPROM cells.

The sense ratio for the circuitry illustrated in FIG. 8 is four-to-one. According to the principles of this invention, the sense ratio ranges from (1.5:1.) to (5.:1.) and is typically in the range of (2.:1.) to (3.:1).

Figure 9A:
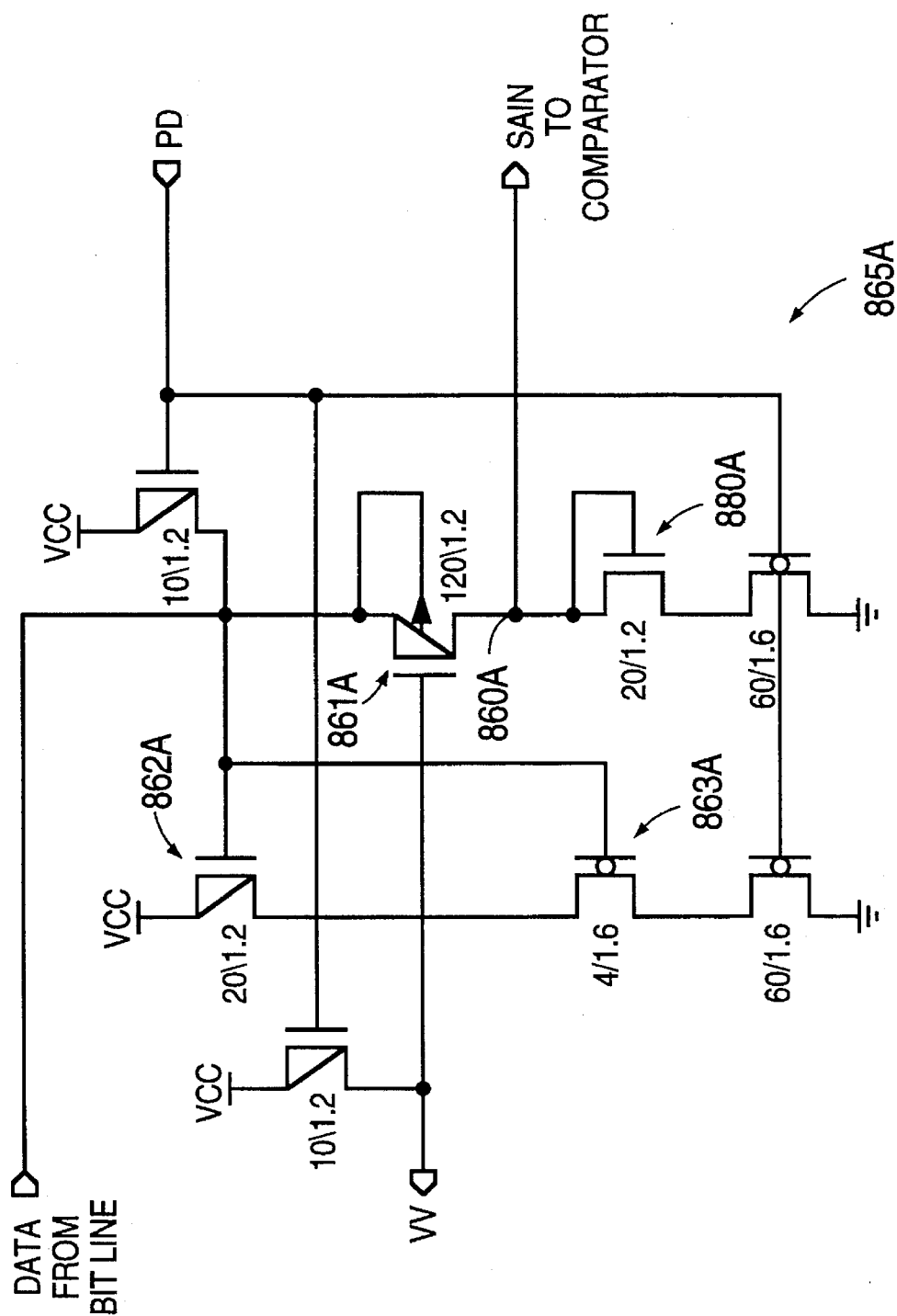
FIGS. 9A and 9B are schematic diagrams of another embodiment of the resistive elements and the cascode preamplifiers of the sense circuit of this invention that includes a cascode preamplifier for a flash EEPROM array with overerased flash EEPROM cells.
Figure 9B:
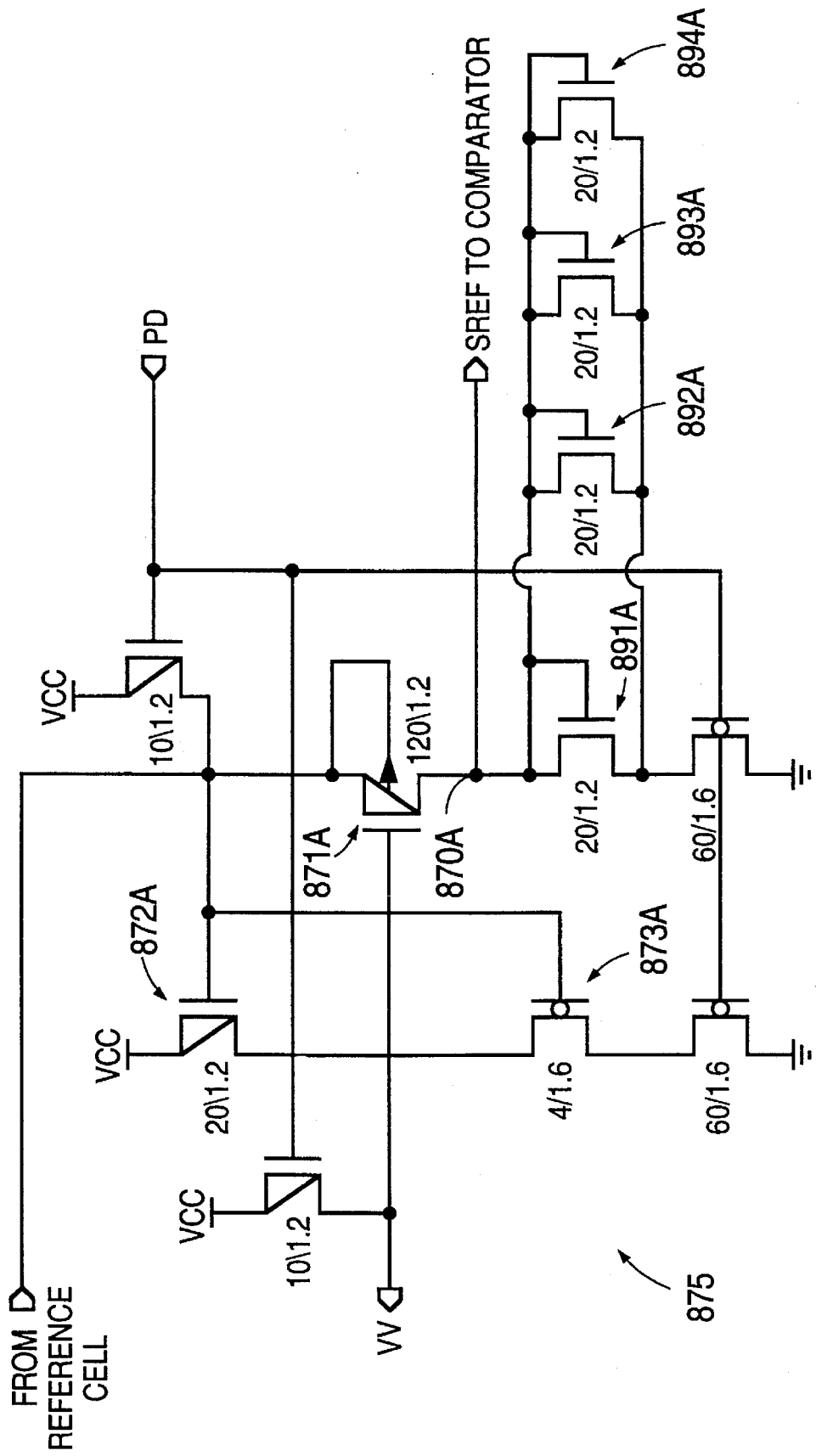

Each cascode pre-amplifier 865, 875 has a total voltage gain of about nine with an output signal swing of about 300 mV in typical situations. The output signal level is referenced to source supply voltage $V_s$ by the amount of the N-channel MOSFET threshold voltage Vtn. FIGS. 9A, 9B illustrate another embodiment of the cascode pre-amplifier of this invention that includes power down circuitry.

Figure 10:
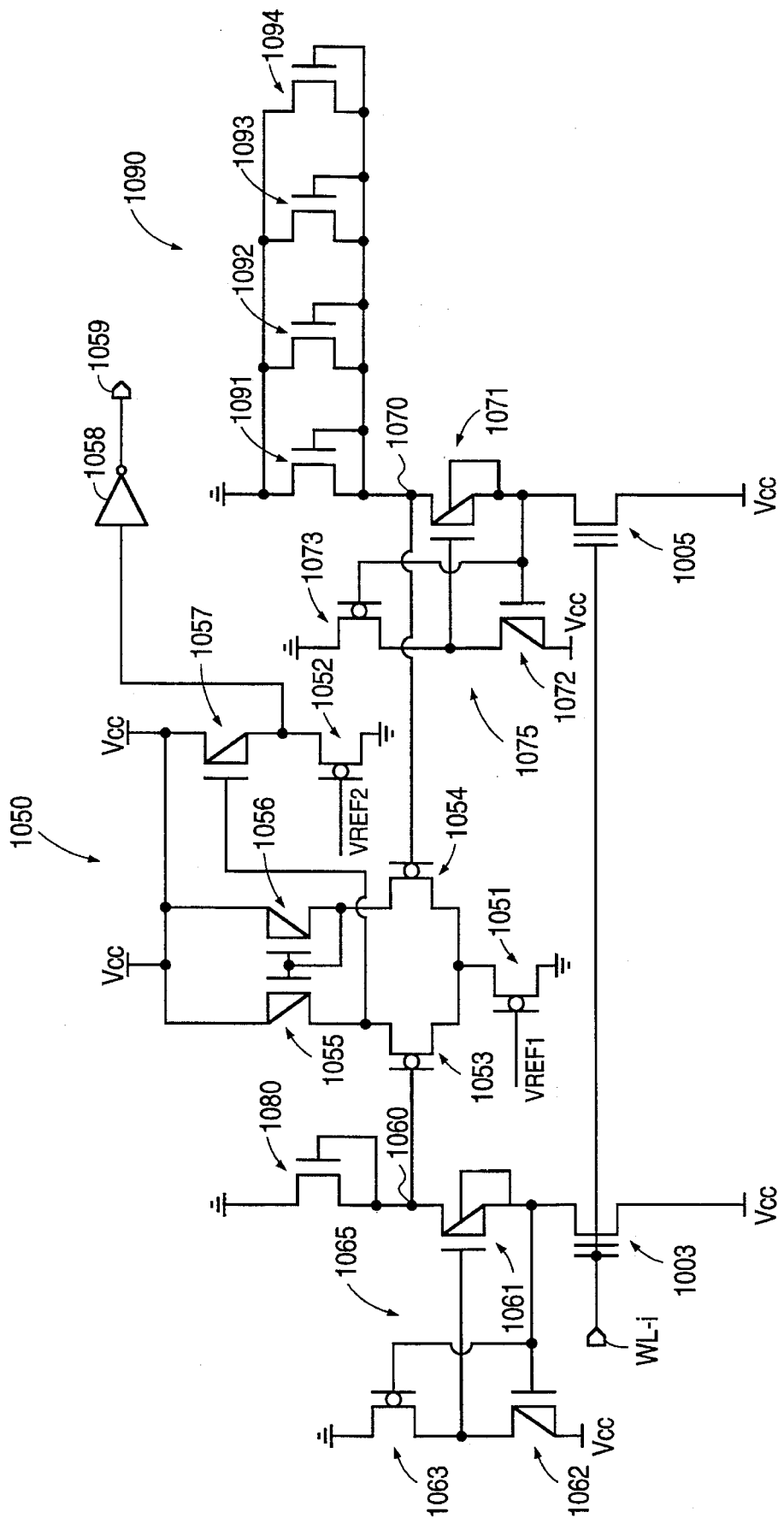
FIG. 10 is a detailed schematic diagram of the sense circuit of this invention that includes the resistive elements, the cascode preamplifiers, and a specific comparator circuit for a flash EEPROM array with overerased flash EEPROM cells.

FIG. 10 is similar to FIG. 8, but in FIG. 10, comparator 1050 is shown in more detail as comparator 750. The signal level at point 1060, i.e., the output signal of cascode pre-amplifier 1065, drives the gate of N-channel intrinsic MOSFET 1053. Similarly, the signal level at point 1070, i.e., the output signal of cascode pre-amplifier 1075, drives the gate of intrinsic N-channel MOSFET 1054. The source of MOSFETs 1053 and 1054 are connected to a first current source, i.e. N-channel intrinsic MOSFET 1051.

The drain of MOSFET 1053 is connected to the drain of a first P-channel MOSFET 1055, while the drain of MOSFET 1054 is connected to the drain of a second P-channel MOSFET 1056. The sources of MOSFETs 1055 and 1056 are connected to power supply voltage $V_{CC}$. The gates of MOSFETs 1055 and 1056 are connected to the drain of MOSFET 1054.

The drain of MOSFET 1053 is connected to the gate of a third P-channel MOSFET 1057. The source of MOSFET 1057 is connected to power supply voltage $V_{CC}$. The drain of MOSFET 1057 is connected to a second current source, i.e. N-channel intrinsic MOSFET 1052, and to an input terminal of invertor 1058. The output signal from invertor 1058 is the output signal of comparator 1050. The input signals to the gates of MOSFET 1051 and 1052 are voltages VREF1 and VREF2, respectively. Voltage VREF1 and VREF2 are derived from power supply voltage $V_{CC}$. See for example FIG. 11.

The basic configuration of comparator 1050 is a differential amplifier driving a differential single-ended converter. The input stage of the differential amplifier uses two intrinsic MOSFETs 1053, 1054. The intrinsic MOSFETs are key to operation at low power supply voltages, such as three volts, as explained more completely below. The current from the input stage is mirrored by P-channel MOSFETs 1055 and 1056 in a second stage and supplied to the output stage, i.e., P-channel MOSFET 1057 and the second current source.

The differential amplifier is designed with reference to source supply voltage $V_s$ since the output signal from each cascode pre-amplifier 1065, 1075 is referenced to source supply voltage $V_s$. Since the output level of cascode pre-amplifiers 1065, 1075 is relatively low, a low drain-to-source saturation voltage current-sink with low gate-bias is used to retain the common-mode input range. The characteristics of comparator 1050 in this embodiment are:

| | |
|---|---|
| DC gain | 47 dB |
| 3 dB-width | 13 MHz |
| Common Mode Rejection Ratio at 1 MHz | 51 dB |

Figure 11:
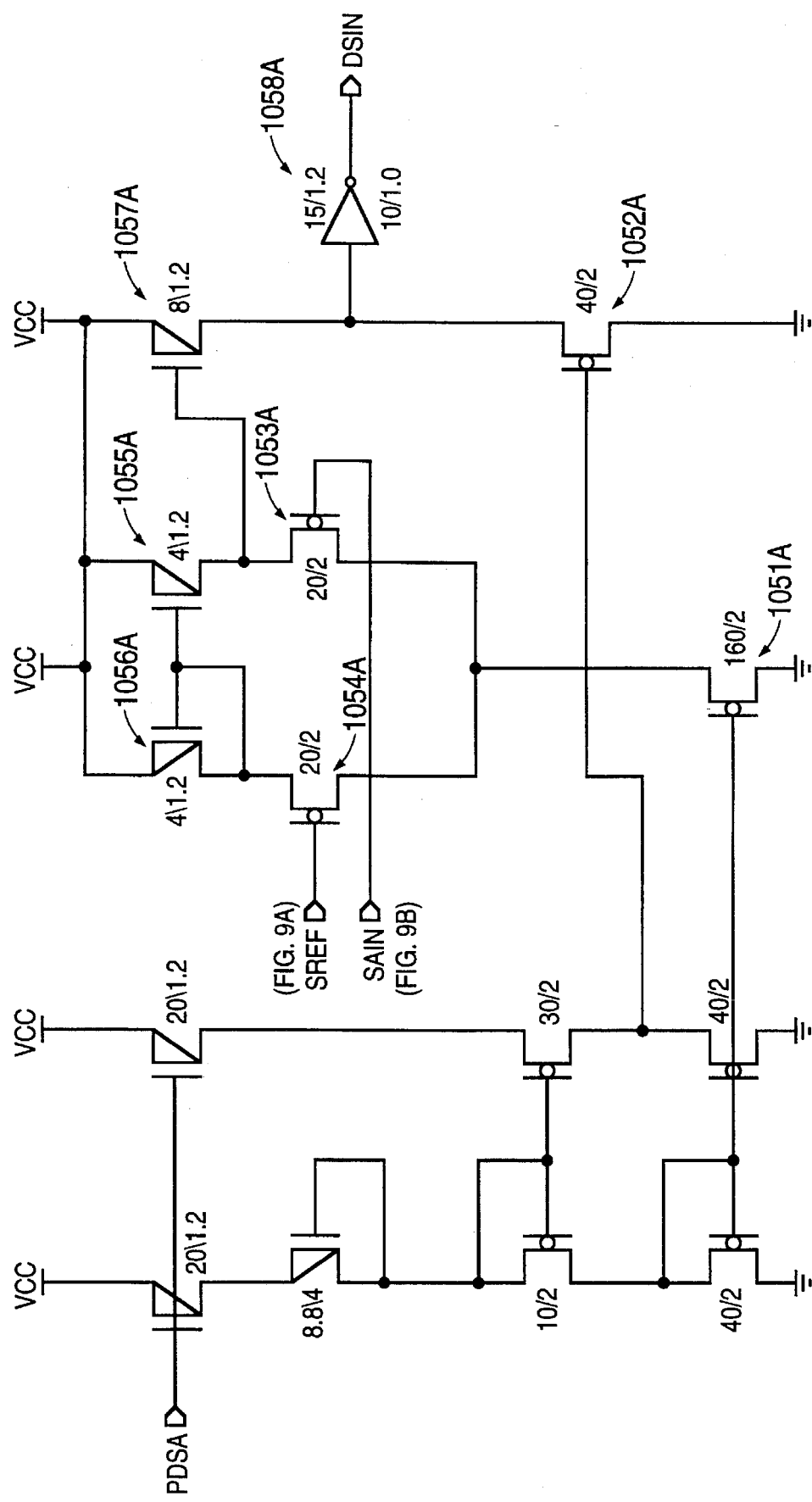
FIG. 11 is a schematic diagram of another embodiment of the comparator circuit of the sense circuit of this invention for a flash EEPROM array with overerased flash EEPROM cells.

The current in the differential input stage is about 100 μA and the current in the second stage is about 110 μA. FIG. 11 illustrates a detailed schematic diagram of one embodiment comparator circuit 1050.

Typically, a prior art comparator circuit required a power supply voltage level of at least two threshold voltages plus some signal level margin. Further, other transistors in the prior art comparator usually raised the required voltage to three thresholds plus some signal level, but the three thresholds alone were in the range of 2.5 to 3 volts. Consequently, with a three volt power supply, the prior art comparators would not function adequately.

However, the thresholds for intrinsic MOSFETs 1053, 1054 are on the order of zero volts. Therefore, the power supply requirements for comparator 1050 are dictated by the signal requirement to have some current flowing through comparator 1050 and P-channel MOSFETs 1055 and 1056. Hence, comparator 1050 works with a power supply voltage of about 1.5 volts or greater.

Intrinsic N-channel MOSFETs 1053 and 1054 are each a single layer intrinsic polysilicon N-channel FET with about a 190 Å gate oxide. The source and drain diffusions are about 0.3 μm deep. The channel regions of MOSFETs 1053 and 1054 each have a width of about 20 μm and a length of about 2 μm.

P-channel MOSFETs 1055, 1056, and 1057 are each a single layer polysilicon P-channel FET with about a 190 Å gate oxide. The source and drain diffusions are about 0.4 μm deep. The channel regions of MOSFETs 1055 and 1056 each have a width of about 4 μm and a length of about 1.2 μm. The channel region of MOSFET 1057 has a width of about 8 μm and a length of about 1.2 μm.

Invertor 1058 is a standard CMOS invertor with a P-channel MOSFET having a channel width of 15 μm and a length of about 1.2 μm and an N-channel MOSFET having a channel width of 10 μm and a length of about 1 μm.

FIG. 11 is another embodiment of comparator 1050 of this invention that includes additional MOSFETs which are used as power switches. The numbers adjacent to each transistor are the channel width to length ratio.

Figure 12:
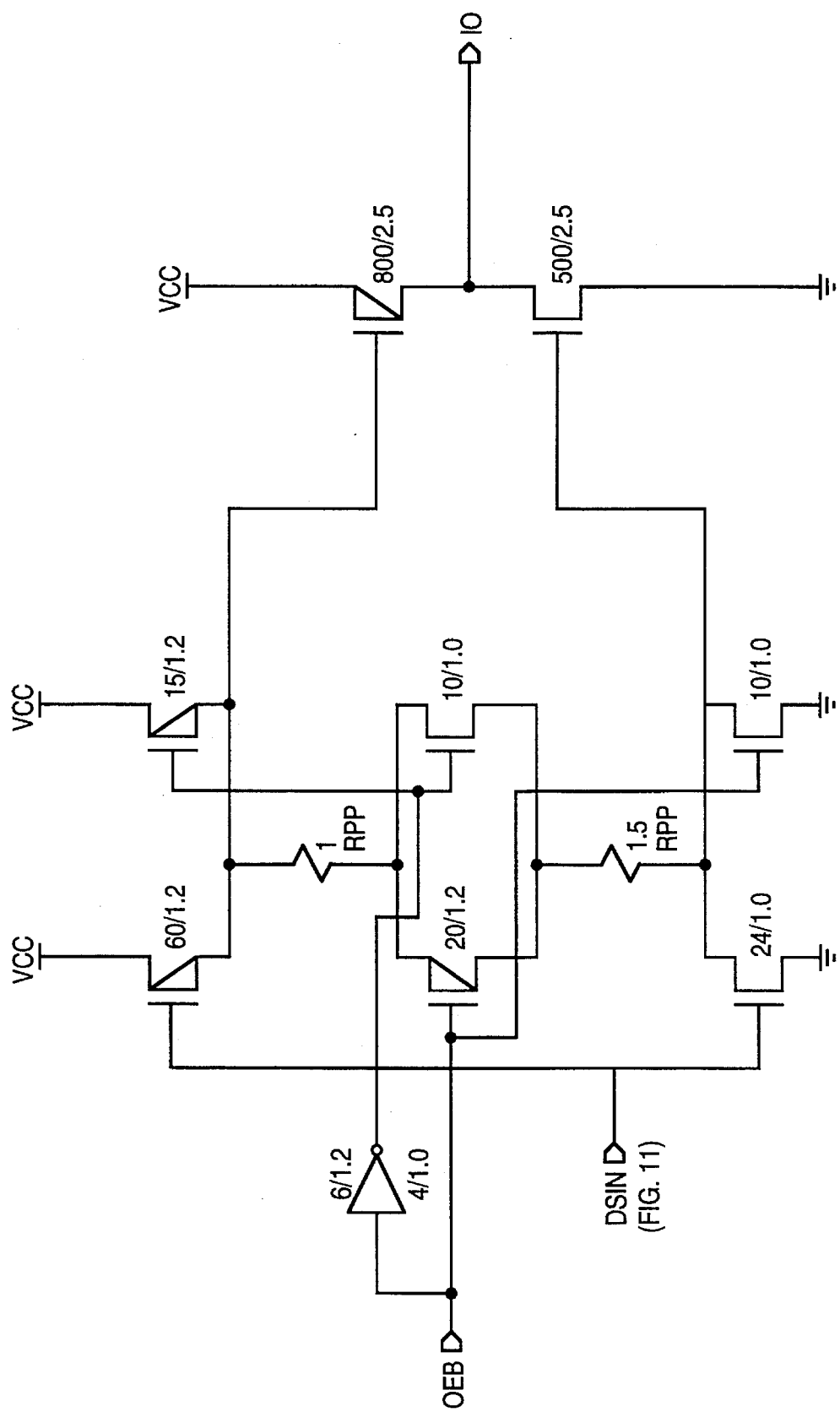
FIG. 12 illustrates one embodiment of an output buffer circuit suitable for use with the sense circuit of this invention.

FIG. 12 is one embodiment of an output buffer for use with the sense circuitry of this invention. Input line OEB to output buffer carries a signal that is used to enable output buffer.

In one embodiment, the sense circuitry of this invention is formed in a P-conductivity type silicon substrate having a resistivity of 20 ohm-cm. The source and drain regions for the P-channel MOSFETS are formed using a $6 \times 10^{15}$ ions/ cm² implant of BF₂ at 60 Kev. The source and drain regions for the N-channel MOSFETS are formed using a $7 \times 10^{15}$ ions/cm² implant of BF₂ at 60 Kev. The channel implant for both the P- and N-channel MOSFETS is $1.2 \times 10^{12}$ of BF₂ at 50 Kev. An N-type conductivity well for the P-channel MOSFETS is formed by using a high temperature driven-in of a $7.5 \times 10^2$ ions/cm² implant of $P_{31}$ (phosphorous) at 120 Kev. Similarly, a P-type conductivity well for the N-channel MOSFETS is formed by using a high temperature driven-in of a $2.5 \times 10^{12}$ ions/cm² implant of Boron 11 at 26 Kev. The N-channel MOSFETS have a deep channel implant of 1.45 ions/cm² of Boron 11 at 160 Kev. A high temperature, greater than 900° C., driven-in is used for each of the implants.

The embodiments described above are only illustrative of the principles of this invention and are not intended to limit the invention to the particular embodiments disclosed. For example, the flash EEPROM architecture of this invention was described in terms of a single array. However, this array can represent a page, for example, in a paged flash EEPROM architecture in view of U.S. Pat. No. 5,077,691. Also, particular voltages levels on the drains, sources and control gates of the cells have been described for programming, reading, and erasing the cells. In view of this disclosure, those skilled in the art will appreciate that other combinations of voltages could be utilized to prevent leakage from overerased cells disturbing operation of the array.

We claim:

1. A sense circuit for sensing a state of a flash EEPROM cell having a source, that functions as an electrical drain, connected to a first voltage level, and a drain, that functions as an electrical source, connected to a second voltage level that is less than said first voltage level, said sense circuit comprising:

a preamplifier having a first line coupled to said electrical source of said flash EEPROM cell and a second line, wherein said flash EEPROM cell has a negative delta threshold voltage; and a resistive element having a first line connected to said second line of said preamplifier and a second line connected to a third voltage level that is less than said second voltage level.

2. The sense circuit of claim 1 wherein said preamplifier comprises a cascode preamplifier.

3. The sense circuit of claim 2 wherein said cascode preamplifier comprises:

a first P-channel MOS field effect transistor (FET) having a source connected to said first line of said cascode preamplifier; a drain connected to said first line of said resistive element; and a gate;

a second P-channel MOSFET having a gate connected to said first line of said cascode preamplifier; a source connected to said first voltage level; and a drain connected to said gate of said first P-channel MOSFET; and an N-channel MOSFET having a gate connected to said first line of said cascode preamplifier; a source connected to said third voltage level; and a drain connected to the drain of said second P-channel MOSFET.

4. The sense circuit of claim 3 wherein said n-channel MOSFET is an intrinsic N-channel MOSFET and said first voltage level is about three volts.

5. The sense circuit of claim 1 further comprising:

a comparator having a first input line connected to said first line of said resistive element and a second input line.

6. The sense circuit of claim 5 wherein said comparator further comprises:

a differential input stage connected to said first and second comparator input lines; and a second stage connected to said differential input stage.

7. The sense circuit of claim 6 wherein said differential input stage includes an intrinsic MOSFET having a gate connected to said first input line of said comparator.

8. The sense circuit of claim 1 wherein said resistive element comprises a MOSFET with a gate connected to one of two regions of a selected conductivity which comprise a source and a drain of said MOSFET.

9. The sense circuit of claim 5 further comprising another resistive element having a first line connected to said second input line of said comparator and a second line connected to said third voltage level wherein said another resistive element has a resistance that is less than a resistance of said resistive element.

10. The sense circuit of claim 9 further comprising another preamplifier having a first line coupled to a source, that functions as an electrical drain, of another flash EEPROM cell, and a second line connected to said first line of said resistive element.

11. A sense circuit for sensing a state of a flash EEPROM cell having an electrical drain connected to a first voltage level and an electrical source connected to a second voltage level that is less than said first voltage level, said sense circuit comprising:

a cascode preamplifier having a first line coupled to said electrical source of said flash EEPROM cell and a second line; and a resistive element having a first line connected to said second line of said cascode preamplifier and a second line connected to a third voltage level that is less than said second voltage level;

wherein said cascode amplifier further comprises:

a first P-channel MOS field effect transistor (FET) having a source connected to said first line of said cascode preamplifier; a drain connected to said first line of said resistive element; and a gate;

a second P-channel MOSFET having a gate connected to said first line of said cascode preamplifier; a source connected to said first voltage level; and a drain connected to said gate of said first P-channel MOSFET; and an N-channel MOSFET having a gate connected to said first line of said cascode preamplifier; a source connected to said third voltage level; and a drain connected to the drain of said second P-channel MOSFET.

12. The sense circuit of claim 11 wherein said N-channel MOSFET is an intrinsic N-channel MOSFET and said first voltage level is about three volts.

13. The sense circuit of claim 11 further comprising:

a comparator having a first input line connected to said first line of said resistive element and a second input line.

14. The sense circuit of claim 13 wherein said comparator means further comprises a differential input stage connected to said first and second comparator input lines; and a second stage connected to said differential input stage.

15. The sense circuit of claim 14 wherein said differential input stage includes an intrinsic MOSFET having a gate connected to said first input line of said comparator.

16. The sense circuit of claim 11 wherein said resistive element comprises a MOSFET with a gate connected to one of two regions of a selected conductivity which comprise a source and a drain of said MOSFET.

17. A sense circuit for sensing a state of a flash EEPROM cell having an electrical drain connected to a first voltage level and an electrical source connected to a second voltage level that is less than said first voltage level, said sense circuit comprising:

a preamplifier having a first line coupled to said electrical source of said flash EEPROM cell and a second line;

a resistive element having a first line connected to said second line of said preamplifier and a second line connected to a third voltage level that is less than said second voltage level; and a comparator having a first input line connected to said first line of said resistive element and a second input line.

18. The sense circuit of claim 17 wherein said preamplifier comprises a cascode preamplifier.

19. The sense circuit of claim 18 wherein said cascode preamplifier comprises:

a first P-channel MOS field effect transistor (FET) having a source connected to said first line of said cascode preamplifier; a drain connected to said first line of said resistive element; and a gate;

a second P-channel MOSFET having a gate connected to said first line of said cascode preamplifier; a source connected to said first voltage level; and a drain connected to said gate of said first P-channel MOSFET; and an N-channel MOSFET having a gate connected to said first line of said cascode preamplifier; a source connected to said third voltage level; and a drain connected to the drain of said second P-channel MOSFET.

20. The sense circuit of claim 19 wherein said N-channel MOSFET is an intrinsic N-channel MOSFET and said first voltage level is about three volts.

21. The sense circuit of claim 17 wherein said comparator further comprises a differential input stage connected to said first and second comparator input lines; and a second stage connected to said differential input stage.

22. The sense circuit of claim 21 wherein said differential input stage includes an intrinsic MOSFET having a gate connected to said first input line of said comparator.

23. The sense circuit of claim 17 wherein said resistive element comprises a MOSFET with a gate connected to one of two regions of a selected conductivity which comprise a source and a drain of said MOSFET.

* * * * *